(12) United States Patent
Nabatame et al.

(10) Patent No.: US 6,198,119 B1
(45) Date of Patent: Mar. 6, 2001

(54) FERROELECTRIC ELEMENT AND METHOD OF PRODUCING THE SAME

(75) Inventors: Toshihide Nabatame, Hitachi; Takaaki Suzuki, Hitachinaka; Tomoji Oishi, Hitachi; Ken Takahashi, Tokai-mura; Kunihiro Maeda, Hitachi, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 08/814,382

(22) Filed: Mar. 11, 1997

(30) Foreign Application Priority Data

Mar. 13, 1996 (JP) .................................... 8-055772

(51) Int. Cl.$^7$ .................................................. H01L 29/22
(52) U.S. Cl. .......................... 257/295; 257/298; 257/300; 257/308; 257/310
(58) Field of Search ..................... 257/295, 308, 257/298, 300, 310

(56) References Cited

U.S. PATENT DOCUMENTS

| | | |
|---|---|---|
| 4,054,531 | 10/1977 | Takahashi et al. . |
| 4,131,903 | * 12/1978 | Schmelz et al. ........................ 257/295 |
| 5,337,209 | 8/1994 | Sutherland et al. . |
| 5,742,472 | * 4/1998 | Lee et al. ............................. 257/306 |
| 5,889,299 | * 3/1999 | Abe et al. ............................. 257/295 |

FOREIGN PATENT DOCUMENTS

| | | |
|---|---|---|
| 0505112 | 9/1992 | (EP) . |
| 0514149 | 11/1992 | (EP) . |
| 93/12542 | 6/1993 | (WO) . |
| 94/03908 | 2/1994 | (WO) . |

OTHER PUBLICATIONS

Nakamura, T. et al., "Preparation of C–Axis–Oriented Bi4Ti3012 Thin Films by Metalorganic Chemical Vapor Deposition", in *Jpn. J. Appl. Phys.*, vol. 32, No. 9B, Sep. 1, 1993, pp. 4086–4088.

Masaji Yoshida, "Chemical Vapor Deposition of (BA,SR)TI03", Extended Abstracts, vol. 93/2, Jan. 1, 1993, p. 264.

Mendiola, J. et al., "Pulsed Laser Deposition of Ca Modified PbTiO$_3$ thin films", vol. 29, No. 1–4, Microelectronic Engineering, Dec. 1995, pp. 209–212.

(List continued on next page.)

*Primary Examiner*—Edward Wojciechowicz
(74) *Attorney, Agent, or Firm*—Antonelli, Terry, Stout & Kraus, LLP

(57) ABSTRACT

A ferroelectric element is provided that can be highly densely integrated having a high Pr and a small Ec by using a ferroelectric thin film of the perovskite structure. A large distortion is imparted to the crystalline lattices of a ferroelectric thin film of the perovskite structure by using in combination elements having dissimilar ionic radii for the A-site that constitutes crystalline lattices, for the B-site and for the C-site that produces polarization, in order to obtain a ferroelectric element of a structure in which the ferroelectric thin film exhibiting a high spontaneous polarization and a small coersive electric field is sandwiched by the electrodes.

49 Claims, 6 Drawing Sheets

STRUCTURE OF A SEMICONDUCTOR
FIELD - EFFECT TRANSISTOR

OTHER PUBLICATIONS

Funakubo, J. et al., "General Rule for the Determination of C–Axis Orientation of Pb–based tetragonal Ferroelectric Oxide Film Prepared by CVD", May 1995, vol. 14, No. 9, pp. 629–632 (XP–002067856).

Yamaka, E. et al., "Structural Ferroelectric, and Pyroelectric Properties of Highly C–Axis Oriented $Pb_{1-x}Ca_xTiO_3$ Thin Film Grown by Radio–Frequency Magnetron Sputtering", in *J. of Vacuum Science & Technology*, vol. 6, No. 5, Sep. 1, 1988, pp. 2921–2928.

Millan, P. et al., "Substitutions of Smaller $Sb^{3+}$ and $Sn^{2+}$ Cations for $Bi^{3+}$ in Aurivillius–like Phases", in *Journal of Materials Science Letters*, vol. 14, No. 23, Dec. 1995, pp. 1657–1660.

Huang, B. et al., "Dielectric Properties of Bismuth Layer Type Ceramics with Lanthanum and Nickel Co–Substitutions", ISAF '92 Aug. and Sep. 1992, pp. 381–384.

Kojima, S. et al., "Raman Study of Ferroelectric Bismuth Layer–Oxides $Abi_4Ti_4O_{15}$", in *Journal of Materials Science Letters*, vol. 348, Mar. 15, 1995, pp. 37–40.

Patent Abstracts of Japan, Publication No. 05024994 (Feb. 2, 1993).

Torii, K. et al., "Dielectric Properties of Rf–Magnetron––Sputtered $(Ba,Pb)(Zr,Ti)O_3$ Thin Films", in *Jpn. J. Appl. Phys.*, vol. 31, No. 9B, Sep. 1992, pp. 2989–2991.

* cited by examiner

CYSTALLINE STRUCTURE OF
$(AO)^{2+} (B_2 C_3 O_{10})^{2-}$

- ⊙ A
- ● B
- ◍ C

CYSTALLINE STRUCTURE OF
$(Bi_{2-x}A_xO_2)^{2+} (B_2C_3O_{10})^{2-}$

- ⊙ $Bi_{2-x}A_x$
- ● B
- ◍ C

WHERE $0 < x < 2$ (100) - OR (010) - ORIENTATION (110) - ORIENTATION

ORIENTATION IN WHICH THE
C - AXIS IS TILTED AT 45°

(001) - ORIENTATION (100) - OR (010) - ORIENTATION (110) - ORIENTATION

ORIENTATION IN WHICH THE C - AXIS IS TILTED AT 45°

STRUCTURE OF A SEMICONDUCTOR
FIELD - EFFECT TRANSISTOR

SEMICONDUCTOR MOS STRUCTURE

SEMICONDUCTOR MOS STRUCTURE

FERROELECTRIC ELEMENT AND METHOD OF PRODUCING THE SAME

BACKGROUND OF THE INVENTION

The present invention relates to an FRAM utilizing non-volatility, as an infrared ray sensor utilizing the pyroelectric effect, a memory element and a ferroelectric element widely used as a communications part, a memory cell thereof, and a method of producing the same.

A non-volatile semiconductor memory, such as a ROM (read-only memory), which is able to hold stored data even when the power source is turned off, has an inherent problem in that a limitation is imposed on the number of times data and the speed is low. On the other hand, a RAM (random access memory) features a high data rewriting speed. In particular, an FRAM which uses a ferroelectric material exhibits very excellent non-volatility as well as the ability to rewrite data a great number of times, such as 1010 to 1012 times, owing to the use of two residual polarizations of different polarities. Besides, the rewriting speed is as fast as a value in the order of $\mu s$ or shorter, and so this memory is drawing attention as an ideal memory of the next generation.

Efforts have been made to develop a FRAM having a large capacity, featuring non-volatility and operating at high speeds. However, the affinity to wear of the film is a serious problem in that the spontaneous polarization (Pr) of the ferroelectric material decreases with an increase in the number of times of writing. It has been known that the capacity can be increased and the durability can be improved (1) by employing a ferroelectric material having a large spontaneous polarization (Pr), and (2) by employing a ferroelectric material which is immune to wear. Oxides of the perovskite structure have been widely used as such materials. Among them, it has been known that PZT (Pb $(Zr_{1-x}Ti_x)O_3$) which is a single lattice having a crystal structure which is the perovskite structure, exhibits a large Pr without crystalline anisotropy. A diode made of this material which is used as a non-volatile memory has been disclosed in International Electron Device Meeting Technical Digest 1989, p. 255 (IEEE IEDM Tech. Dig.: 255– 256, 1989). There has further been known SrBi2Ta2O9 of a Bi laminar ferroelectric material having a crystalline structure in which a plurality of single lattices of the perovskite structure are overlapped one upon the other. In this material, Pr exhibits a crystalline anisotropy only in a direction perpendicular to the c-axis. Though the Pr value is not so large, the material exhibits an excellent resistance to wear. Examples of using this material have been disclosed in Patents WO93/12542 and PCT/US92/10627.

SUMMARY OF THE INVENTION

According to the above-mentioned prior art, however, it has been impossible to provide a ferroelectric material exhibiting a high spontaneous polarization (Pr) which is indispensable for further increasing the degree of integration, a low coersive electric field (Ec) and an excellent resistance to wear. In a memory using PZT (Pb($Zr_{1-x}Ti_x$)O_3) of a single lattice having a crystalline structure which is a perovskite structure an attempt, has been made to lower the operating voltage entailed by an increase in the degree of integration. The operating voltage of the memory varies in proportion to the product of the thickness of the ferroelectric thin film and the coersive electric field. In order to lower the operating voltage, therefore, a process control has been studied in order to decrease the thickness of the ferroelectric thin film to be not larger than 100 nm. According to the above-mentioned prior art for decreasing the thickness of the film, however, a transition layer is formed due to the diffusion reaction of elements on the interface between the ferroelectric thin film and the metal electrode, bringing about problems such as a decrease in the spontaneous polarization and a wear of the film permitting the coersive electric field to increase. This stems from the fact that the ferroelectric material (PZT) of the oxide is so close to the metal electrode (Pt) that oxygen of PZT diffuses into Pt through the interface. Therefore, the number of times of writing the data by inverting the electric field is greatly limited.

In the Bi laminar ferroelectric material according to a prior art having the crystalline structure in which a plurality of single lattices of the perovskite structure are superposed one upon the other, no oxygen diffuses through the interface with the metal electrode, formation of the transition layer is suppressed, and excellent resistance is exhibited against wear of film. However, the spontaneous polarization is small and, when the electric field is applied in parallel with the c-axis, the polarization exhibits a strong crystalline anisotropy only in a direction perpendicular to the c-axis. This is because in the crystalline structure of the Bi laminar ferroelectric material, Ta atoms which cause spontaneous polarization due to a blocking layer of a Bi—O layer composed of two layers are polarized in directions opposite to each other along the c-axis direction. In the Bi laminar ferroelectric material, furthermore, the crystals grow preferentially in a direction perpendicular to the c-axis. In the structure consisting of the upper electrode, ferroelectric material and lower electrode according to the prior art, therefore, the amorphous Bi laminar ferroelectric material is formed on the amorphous lower electrode and is then subjected to a quick-heating processing to grow crystals having random crystalline directions (the orientation degree is not larger than 60%). Among them, only those crystals of the Bi laminar ferroelectric material having the c-axis perpendicular to the direction of the applied electric field work to produce polarization. Therefore, the practically effective crystals are 50%, which is not efficient. According to the prior art, furthermore, the electrode is composed of a metal such as Pt, Al, Au, or Ni inhibiting the transmission of light, and is not suitable as an element for optical response systems.

The present invention has been accomplished in order to solve the above-mentioned problems, and provides a ferroelectric thin film of perovskite crystalline structure without two blocking layers that suppress spontaneous polarization, provides a ferroelectric element having a ferroelectric thin film sandwiched between the upper and lower electrodes or between the right and left electrodes, provides a ferroelectric memory cell, and provides a method of producing the ferroelectric element.

Another object of the present invention is to provide a ferroelectric thin film of perovskite structure including two blocking layers and exhibiting a large spontaneous polarization and a weak coersive electric field by arbitrarily imparting lattice distortion by replacing elements having dissimilar ionic radii, to provide a ferroelectric element having a ferroelectric thin film sandwiched between the upper and lower electrodes or between the right and left electrodes, and to provide a method of producing the ferroelectric element.

The present invention further provides a method of producing a ferroelectric element having an excellent resistance to wear by suppressing the formation of a transition layer by using an electrically conductive oxide as the electrode that is in contact with the ferroelectric thin film, as well as a method of producing the ferroelectric element.

DETAILED DESCRIPTION OF THE PREFERRED EMBODIMENTS

Figure 1:
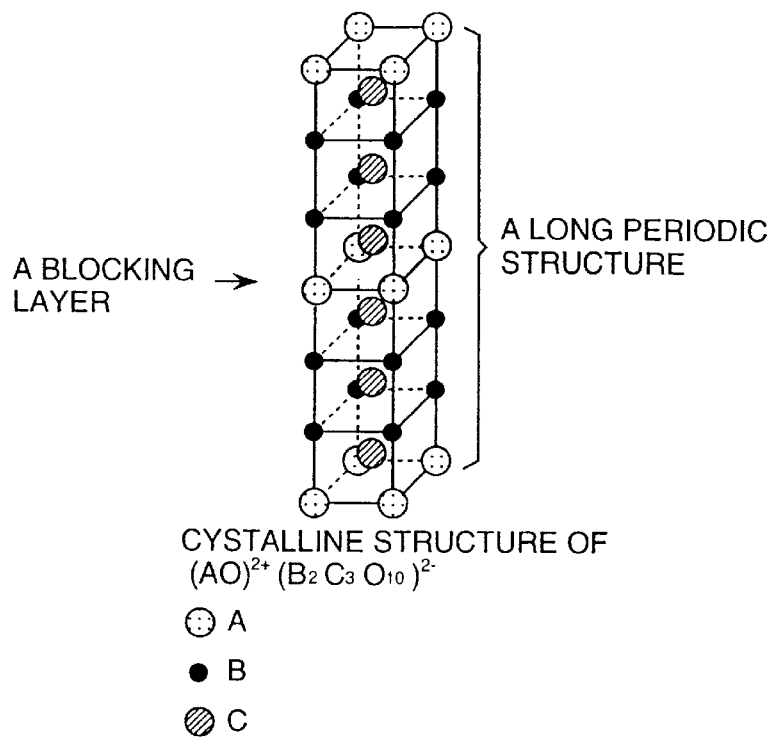
FIG. 1 is a diagram illustrating the crystalline structure of a ferroelectric thin film of the present invention.

In order to achieve the above-mentioned object, a first ferroelectric element is constituted by an upper electrode, a ferroelectric thin film and a lower electrode, wherein the ferroelectric thin film has a laminar crystalline structure, in which a plurality of single lattices of perovskite structure are superposed one upon the other, and a blocking layer in a long periodic structure.

Furthermore, the ferroelectric thin film having the laminar perovskite structure and the blocking layer is represented by a chemical structural formula:

   (Chemical formula 1)

A=Tl, Hg, Ce, Y, Pr, Nd, Pm, Eu, Gd, Tb, Dy, Ho, Er, Tm, Yb, La, Sm,

B=at least one or more of Bi, Pb, Ca, Sr, Ba,

C=at least one or more of Ti, Nb, Ta, W, Mo, Fe, Co, Cr, Zr, and y=2, 3, 4, 5.

Furthermore, the ferroelectric thin film having the laminar perovskite structure and the blocking layer is represented by a chemical structural formula:

   (Chemical formula 2)

B=at least one or more of Ca, Sr, Ba,

C=at least one or more of Ti, Nb, Ta, W, Mo, Fe, Co, Cr, Zr, and y=2, 3, 4, 5.

In the present invention, furthermore, the ferroelectric thin film is (100)-oriented, (010)-oriented, (110)-oriented or (001)-oriented, or the c-axis is tilted at 45° with respect to the lower electrode to obtain a high spontaneous polarization.

In the present invention, furthermore, the ratio of the ferroelectric thin film which is (100)-oriented or (010)-oriented to the lower electrode is not smaller than 70% to obtain effective spontaneous polarization as a ferroelectric element.

In the present invention, furthermore, the ratio of the ferroelectric thin film which is (110)-oriented to the lower electrode is not smaller than 80% to obtain a effective spontaneous polarization as a ferroelectric element.

In the present invention, furthermore, the ratio of the ferroelectric thin film which is (001)-oriented to the lower electrode is not smaller than 70% to obtain a effective spontaneous polarization as a ferroelectric element.

In the present invention, furthermore, the ratio of the ferroelectric thin film of which the c-axis is tilted at 45° with respect to the lower electrode is not smaller than 90% to obtain a effective spontaneous polarization as a ferroelectric element.

A second ferroelectric element is constituted by an upper electrode, a ferroelectric thin film and a lower electrode, wherein the ferroelectric thin film has a perovskite structure and two blocking layers in a long periodic structure.

Furthermore, in the ferroelectric thin film having the perovskite structure, the Bi-site of a Bi—O layer of the two blocking layers is necessarily replaced by an elements(Tl, Hg, Sb, As,) having dissimilar ionic radii, and is represented by:

   (Chemical formula 3)

A=Tl, Hg, Sb, As,

B=at least one or more of Bi, Pb, Ca, Sr, Ba, Y, and rare earth elements,

C=at least one or more of Ti, Nb, Ta, W, Mo, Fe, Co, Cr, Zr,

0<x<2, and y=1, 2, 3, 4, 5.

Furthermore, in the ferroelectric thin film having the perovskite structure, the Bi-site of a Bi—O layer forming the blocking layer is necessarily replaced by an element Pb having dissimilar ionic radius, and is represented by:

   (Chemical formula 4)

B=at least one or more of Bi, Pb, Ca, Sr, Ba, Y, and rare earth elements,

C=at least one or more of Ti, Nb, Ta, W, Mo, Fe, Co, Cr, Zr, or at least two or more of Ti, Nb, Ta, W, Mo, Co, Cr, 0<x<2, and y=1, 2, 3, 4, 5.

In the present invention, furthermore, the ferroelectric thin film is (100)-oriented, (010)-oriented or (110)-oriented, or the c-axis is tilted at 45° with respect to the lower electrode to obtain high spontaneous polarization, considering that the axis of polarization of the ferroelectric thin film is tilted at ±5 degrees to the c-axis due to the two blocking layers.

In the present invention, furthermore, the ratio of the ferroelectric thin film which is (100)-oriented or (010)-oriented to the lower electrode is not smaller than 70% to obtain an effective spontaneous polarization as a ferroelectric element.

In the present invention, furthermore, the ratio of the ferroelectric thin film which is (110)-oriented to the lower electrode is not smaller than 80% to obtain an effective spontaneous polarization as a ferroelectric element.

In the present invention, furthermore, the ratio of the ferroelectric thin film of which the c-axis is tilted at 45° with respect to the lower electrode is not smaller than 90% to obtain an effective spontaneous polarization as a ferroelectric element.

A third ferroelectric element of the present invention is of a planar structure having electrodes on both sides of the ferroelectric thin film. Besides, the ferroelectric thin film has a width which is not larger than 0.3 μm for obtaining a coersive voltage as low as 3 V or less, since the ferroelectric thin film has a laminar perovskite structure expressed by the chemical structural formula of the first ferroelectric element of the invention and the coersive electric field is of the order of 100 kV/cm.

In the present invention, furthermore, the ferroelectric thin film is (100)-oriented, (010)-oriented, (001)-oriented or (110)-oriented, or the c-axis is tilted at 45° with respect to the lower electrode to obtain an high spontaneous polarization.

In the present invention, furthermore, the ratio of the ferroelectric thin film which is (100)-oriented or (010)-oriented to the lower electrode is not smaller than 70% to obtain an effective spontaneous polarization as a ferroelectric element.

In the present invention, furthermore, the ratio of the ferroelectric thin film which is (110)-oriented to the lower electrode is not smaller than 80% to obtain an effective spontaneous polarization as a ferroelectric element.

In the present invention, furthermore, the ratio of the ferroelectric thin film which is (001)-oriented to the lower electrode is not smaller than 70% to obtain an effective spontaneous polarization as a ferroelectric element.

In the present invention, furthermore, the ratio of the ferroelectric thin film of which the c-axis is tilted at 45° with respect to the lower electrode is not smaller than 90% to obtain an effective spontaneous polarization as a ferroelectric element.

A fourth ferroelectric element of the present invention has a planar structure having electrodes on both sides of the ferroelectric thin film. Besides, the ferroelectric thin film has a width which is not larger than 0.3 μm to obtain a coersive voltage as low as 3 V or less, since the ferroelectric thin film has a perovskite structure having two blocking layers expressed by the chemical structural formula of the second ferroelectric element of the invention and the coersive electric field is of the order of 100 kV/cm.

In the present invention, furthermore, the second ferroelectric thin film is (100)-oriented, (010)-oriented, (001)-oriented or (110)-oriented, or the c-axis is tilted at 45° with respect to the lower electrode to obtain a high spontaneous polarization.

In the present invention, furthermore, the ratio of the ferroelectric thin film which is (100)-oriented or (010)-oriented to the lower electrode is not smaller than 70% to obtain an effective spontaneous polarization as a ferroelectric element.

In the present invention, furthermore, the ratio of the ferroelectric thin film which is (110)-oriented to the lower electrode is not smaller than 80% to obtain an effective spontaneous polarization as a ferroelectric element.

In the present invention, furthermore, the ratio of the ferroelectric thin film which is (001)-oriented to the lower electrode is not smaller than 70% to obtain an effective spontaneous polarization as a ferroelectric element.

In the present invention, furthermore, the ratio of the ferroelectric thin film of which the c-axis is tilted at 45° with respect to the lower electrode is not smaller than 90% to obtain an effective spontaneous polarization as a ferroelectric element.

In the present invention, the lower electrode is constituted by a metal, an electrically conductive oxide of a single element and an electrically conductive oxide of a perovskite structure in the order from the underlying substrate, and the electrically conductive oxides are oriented in a particular plane to improve the orientation of the ferroelectric thin film formed on the lower electrode, considering that an oxide can be effectively used as an electrode material that is in contact with the ferroelectric thin film to suppress the diffusion of oxygen from the ferroelectric thin film into the electrode.

In order to suppress the diffusion of oxygen from the ferroelectric thin film into the electrode, furthermore, the upper electrode of the present invention is constituted by an electrically conductive oxide of a perovskite structure, a metal or an electrically conductive oxide of the perovskite structure, an electrically conductive oxide of a single element and a metal in this order from the layer that is in contact with the ferroelectric thin film.

In order to suppress the diffusion of oxygen from the ferroelectric thin film to the electrode, furthermore, the ferroelectric element of the planar structure of the present invention has electrodes on both sides of the ferroelectric thin film, wherein the electrode in contact with the ferroelectric thin film is necessarily constituted by an electrically conductive oxide of a single element or an electrically conductive oxide of perovskite structure.

A metal used for the electrode of the present invention is at least an element selected from the group consisting of Pt, Au, Al, Ni, Cr, Ti, Mo and W. To realize the function of the electrode material, furthermore, an electrically conductive oxide of a single element or of the perovskite structure having a resistivity smaller than 1 mΩ·cm is used as the electrode. The electrically conductive oxide of a single element is an element selected from the group consisting of Ti, V, Eu, Cr, Mo, W, Ph, Os, Ir, Pt, Re, Ru and Sn. The electrically conductive oxide of the perovskite structure is a compound selected from the group consisting of $ReO_3$, $SrReO_3$, $BaReO_3$, $LaTiO_3$, $SrVO_3$, $CaCrO_3$, $SrCrO_3$, $SrFeO_3$, $La_{1-x}Sr_xCoO_3$ (0<x<0.5), $LaNiO_3$, $CaRuO_3$, $SrRuO_3$, $SrTiO_3$ and $BaPbO_3$.

In a fifth ferroelectric element of the present invention, a transparent electrically conductive oxide is used as the upper electrode when the electrodes are provided above and beneath the ferroelectric thin film, and a transparent electrically conductive oxide is used at least as one of the electrodes when the electrodes are provided on both sides of the ferroelectric thin film, in order to obtain an optical response element. The transparent electrically conductive oxide has a resistivity of smaller than 1 mΩ·cm and a transmission factor over a visible region of not smaller than 80%, and is a compound selected from the group consisting of $In_2O_3$, $Sn_2$, ZnO, ITO (In—Sn—O), ATO (Sb-doped Sn), FTO (F-doped Sn), and CTO (Cd—Sn—O).

That is, the method of producing the ferroelectric thin film of the present invention is carried out by sputtering in an atmosphere of a gas formed by a mixture of oxygen and an inert gas at a forming temperature of not higher than 650° C. to suppress the reaction with the electrode. It is further possible to employ a laser vaporization method or a MOCVD method instead of the sputtering method to form the ferroelectric thin film in an atmosphere of oxygen or excited oxygen at a temperature of not higher than 650° C.

Moreover, the method of producing the ferroelectric thin film of the present invention is carried out by spin-coating or dip-coating using a metal alkoxide or an organic acid salt as a starting material under normal pressure at a forming temperature of not higher than 650° C. to suppress the reaction with the electrode.

The method of producing an electrically conductive oxide of a single element or of the perovskite structure of the present invention is carried out by sputtering in an atmosphere of a mixture gas of oxygen and an inert gas at a forming temperature of not higher than 650° C. It is further possible to produce the electrically conductive oxide of a single element or of the perovskite structure by laser vaporization or MOCVD instead of sputtering in an atmosphere of oxygen or excited oxygen at a forming temperature of not higher than 650° C.

Furthermore, the method of producing an electrically conductive oxide of a single element or of the perovskite structure of the present invention is carried out by spin-coating or dip-coating using a metal alkoxide or an organic acid salt as a starting material under normal pressure at a forming temperature of not higher than 650° C.

Moreover, the ferroelectric thin film is produced by spin-coating or dip-coating using a metal alkoxide or an organic acid salt as the starting material while being irradiated with light of an ultraviolet region, considering that the decomposition reaction of the starting material by the irradiation with light is effective in lowering the forming temperature. It is also possible to produce the electrically conductive oxide while being irradiated with light of the ultraviolet region similarly.

In the ferroelectric memory cell of the present invention, the structure of the upper electrode, ferroelectric thin film and lower electrode obtained above, or the planar structure having electrodes on both sides of the ferroelectric thin film, is formed as a capacitor of a semiconductor MOS section.

In the ferroelectric memory cell of the present invention, the structure of the upper electrode, ferroelectric thin film and lower electrode is formed on the gate of a semiconductor field-effect transistor.

According to the present invention, furthermore, the ferroelectric thin film is used as a pyroelectric infrared ray sensor.

The optical response system of the present invention comprises a ferroelectric element using, as an electrode, the transparent electrically conductive oxide obtained above, a pulse light oscillator and a unit for measuring the reflection from the ferroelectric element.

The non-contact type read or write memory of the present invention comprises a combination of a plurality of the ferroelectric memory cells obtained above.

Specifically, the present invention uses a ferroelectric thin film of the perovskite structure represented by a chemical structural formula:

$$(AO)^{2+}(B_{y-1}C_yO_{3y+1})^{2-}$$ (Chemical formula 5)

Figure 2:
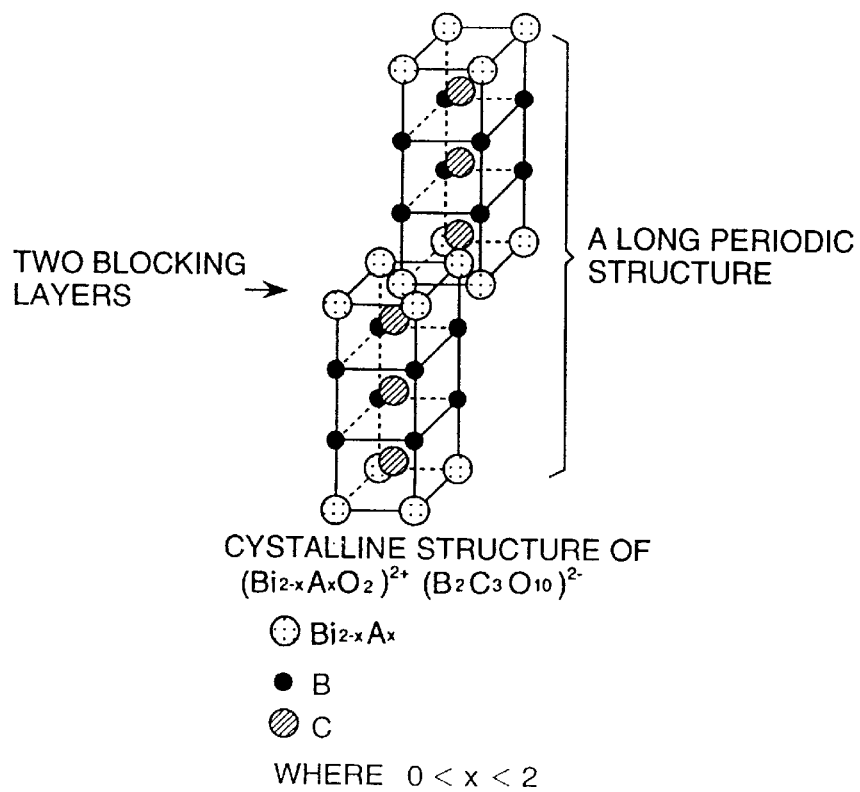
FIG. 2 is a diagram illustrating the crystalline structure of a ferroelectric thin film of the present invention.

(wherein y=2, 3, 4, 5). FIG. 1 illustrates a crystalline structure of a laminar ferroelectric thin film in which six single lattices of the perovskite structure of the present invention when y=3 are superposed one upon another. The material where an element Bi is used for the A-site, an element Sr is used for the B-site and an element Ta is used for the C-cite is the well-known SrBi2Ta2O9(Y1) material. FIG. 2 illustrates a crystalline structure which resembles the above material. A laminar structure has six single lattices of the perovskite structure superposed one upon another. In FIG. 2, the Bi—O layer has a two-layer structure, and the crystalline structure is deviated by a half period in the Bi—O layer. It has been known that the magnitude of spontaneous polarization (Pr) of a ferroelectric material that takes place when an electric field is applied varies greatly depending upon the element and the distortion of the crystalline structure. The material Y1 is polarized by the migration of the element Ta. However, the spontaneous polarization is small since the distortion is small, i.e., the ionic radii of the elements Sr and Bi constituting the lattice are as small as 1.27 Å 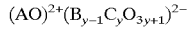 Å and 1.20 Å which are smaller than that of the element Pb (ionic radius of 1.32 Å) constituting the lattice of PZT (Pb($Zr_{1-x}Ti_x$)$O_3$) which exhibits a large spontaneous polarization (Pr). When an electric field is applied in parallel with the c-axis, furthermore, the two elements Ta are polarized in directions opposite to each other due to crystalline symmetry because of the two Bi—O layers. Accordingly, the value Pr in the direction in parallel with the c-axis is 0 $\mu C/cm^2$. When an electric field is applied in a direction perpendicular to the c-axis, on the other hand, the value Pr becomes as great as 16 $\mu C/cm^2$ since there is no crystalline symmetry. Thus, a large crystalline anisotropy is exhibited.

According to the present invention, Tl, Hg, Pb, Y or a rare earth element is used for the A-site in order to form a ferroelectric thin film without anisotropy having a crystalline structure of a single blocking layer instead of two blocking layers like the Bi—O layers that prevent spontaneous polarization. With a plurality of single lattices having the perovskite crystalline structure being superposed one upon another, furthermore, it is possible to form a ferroelectric thin film which exhibits a spontaneous polarization larger than that of PZT which is a single lattice. In order to impart a great distortion to the crystals, furthermore, it is preferable to combine elements having dissimilar ionic radii. A ferroelectric thin film exhibiting a large spontaneous polarization and a small anisotropy can be obtained by a combination of Tl (1.06 Å), Hg (1.16 Å), Pb (1.32 Å), Y (1.06 Å) or a rare earth element such as La (1.22 Å), Ce (1.18 Å), Pr (1.16 Å), Nd (1.15 Å), Sm (1.13 Å), Eu (1.13 Å), Gd (1.11 Å), Tb (1.09 Å), Dy (1.07 Å), Ho (1.05 Å), Er (1.04 Å), Tm (1.04 Å), Yb (1.00 Å) or Lu (0.99 Å) for the A-site, Bi (1.20 Å), Pb (1.32 Å), Ca (1.06 Å), Sr (1.27 Å), or Ba (1.43 Å) having a valency of 2 to 3 for the B-site, and Ti (0.75 Å), Nb (0.83 Å), Ta (0.80 Å), W (0.79 Å), Mo (0.79 Å), Fe (0.69 Å), Co (0.67 Å), Cr (0.69 Å), or Zr (0.86 Å) that produces polarization for the C-site. When an element having a valency which is not +4 is used for the A-site, oxygen at the A-site or oxygen just over the B-site forms a void, so that the crystal becomes stable. To maintain the stability of the laminar structure, it is preferable that y=2, 3, 4 or 5. A ferroelectric thin film exhibiting a large spontaneous polarization and a small anisotropy can be formed even when two or more elements are used in combination for the A-site.

As described above, there could be provided a ferroelectric element which can be highly densely integrated having a structure in which a blocking layer with no spontaneously polarizing crystalline anisotropy is composed of a ferroelectric thin film of a perovskite structure having a high spontaneous polarization and a small coersive electric field imparting an arbitrary large distortion to the crystalline lattice by a combination of elements having dissimilar ionic radii for the A-site, for the B-site that constitutes a crystalline lattice and for the C-site that produces polarization, and the ferroelectric thin film being sandwiched by the electrodes.

Figure 3:
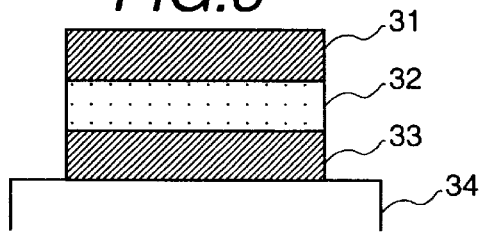
FIG. 3 is a sectional view illustrating a ferroelectric element of the present invention.

In a structure in which the ferroelectric thin film is sandwiched between the upper and lower electrodes as shown in FIG. 3, the directions of polarization must be determined to obtain a high spontaneous polarization value and a low counter electric field. Since the ferroelectric thin film has a laminar crystalline structure, it is possible to obtain a high spontaneous polarization value and a low coersive electric field by setting the orientation of the ferroelectric thin film, as shown in FIGS. 4A to 4D, to (100), (010), or (110), by tilting the c-axis of crystals at 45°, or at (001).

The spontaneous polarization characteristics of the ferroelectric thin film vary greatly depending upon the orientation of the crystals, increasing in the order described below.

(100)-Orientation or (010)-orientation=(001)-orientation>(110)-orientation>orientation in which the c-axis of crystal is tilted at 45°.

To obtain a required spontaneous polarization value of the ferroelectric element, therefore, it is preferable that the ferroelectric thin film has a ratio of (100)-orientation or (010)-orientation of not smaller than 70%. It is similarly preferable that the ferroelectric thin film has the ratio of (001)-orientation of not smaller than 70%, (110)-orientation of not smaller than 80%, or orientation in which the c-axis of crystals is tilted at 45° of not smaller than 90%.

The above-mentioned Y1 is a representative example of when the element Bi is used for the A-site in the chemical structural formula:

$(AO)^{2+}(B_{y-1}C_yO_{3y+1})^{2-}$ (Chemical formula 6)

(wherein y=2, 3, 4 or 5). This material has excellent writing characteristics at the time of the inversion of the electric field though it exhibits a large crystalline anisotropy of spontaneous polarization. However, the absolute spontaneous polarization value is 10 to 13 $\mu C/cm^2$ which is smaller than 20 to 30 $\mu C/cm^2$ of PZT, and the material is not advantageous for fabricating a highly integrated memory. According to the present invention, the Bi-site of the Bi—O layer is necessarily replaced with the element A having a dissimilar ionic radius, and the element at the B-site and the element at the C-site are combined together to give distortion to the crystalline lattice in the chemical structural formula:

$(Bi_{2-x}A_xO_2)^{2+}(B_{y-1}C_yO_{3y+1})^{2-}$ (Chemical formula 7)

(wherein y=1, 2, 3, 4 or 5), in order to increase the spontaneous polarization (Pr). Therefore, the Bi-site having, an ionic radius of 1.20 Å is replaced with Tl (1.06 Å), Hg (1.16 Å), Pb (1.32 Å), Sb (0.90 Å) or As (0.69 Å) which is an element having a different ionic radius, in order to give a distortion to the crystalline lattice and, hence, to form a ferroelectric thin film that exhibits a large spontaneous polarization. The element Pb causes distortion of expansion of the crystals, and other elements Hg, Tl, Sb and As cause distortion of contraction of the crystals. By using Bi, Pb, Ca, Sr, Ba, Y or a rare earth element such as La, Ce, Pr, Nd, Sm, Eu, Gd, Tb, Dy, Ho, Er, Tm, Yb or Lu for the B-site having the above-mentioned ionic radius in combination with Ti, Nb, Ta, W, Mo, Fe, Co, Cr or Zr having a different ionic radius for the C-site, furthermore, the crystalline structure is imparted with a large distortion, and the ferroelectric thin film exhibits a high spontaneous polarization. In order to stabilize the crystals, it is preferable that the degree of substitution at the Bi-site is within a range of 0<x<2, and the laminar structure is within a range of y=1, 2, 3, 4 or 5.

As described above, there could be provided a ferroelectric element such that a ferroelectric thin film of the perovskite structure, including two Bi—O layers, and having a high spontaneous polarization and a small coersive electric field resulting from an arbitrary large distortion produced in crystal lattices by combining elements which have dissimilar ionic radii for the Bi-site, the B-site constituting the crystal lattices, and the C-side causing polarization, is sandwiched between the electrodes.

Figure 5A:
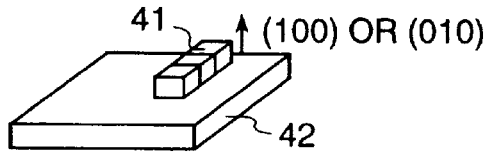
FIGS. 5A to 5C are diagrams schematically illustrating the crystal orientation of the ferroelectric thin film of the present invention.
Figure 5B:
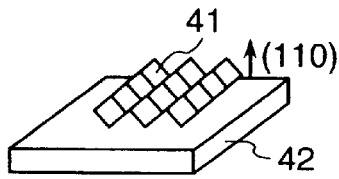
Figure 5C:
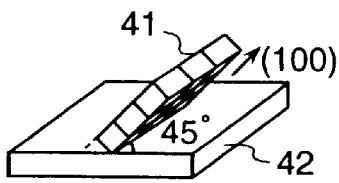

In the above-mentioned ferroelectric thin film, furthermore, the spontaneous polarization exhibits a crystalline anisotropy, and the direction of polarization is tilted at ±5 degrees to the plane a-b. In the structure shown in FIG. 3, therefore, the orientation must be so controlled that the axes of polarization are directed in the vertical direction to obtain a high spontaneous polarization. Referring to FIGS. 5A to 5C, a ferroelectric thin film exhibiting a high spontaneous polarization is obtained such that the orientation of the ferroelectric thin film is (100), (010) or (110), or the c-axis of crystals is tilted at 45°.

Spontaneous polarization characteristics of the ferroelectric thin film vary greatly depending upon the orientation of crystals, increasing in the order described below.

(100)-Orientation or (010)-orientation>(110)-orientation>orientation in which the c-axis of crystals is tilted at 45°.

To obtain a required spontaneous polarization value of the ferroelectric element, therefore, it is preferable that the ferroelectric thin film has a ratio of (100)-orientation or (010)-orientation of not smaller than 70%. It is similarly preferable that the ferroelectric thin film has a ratio of (110)-orientation of not smaller than 80%, or an orientation in which the c-axis of crystals is tilted at 45° of not smaller than 90%.

Figure 6:
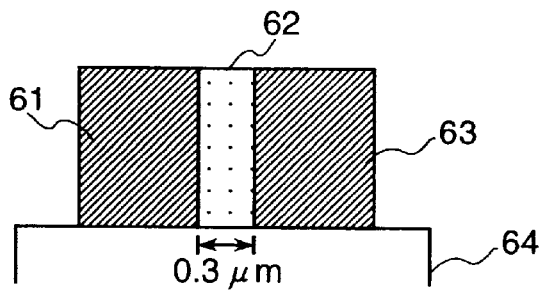
FIG. 6 is a sectional view illustrating a ferroelectric element of the present invention.

FIG. 6 illustrates a ferroelectric element of the planar structure having electrodes on both sides of the ferroelectric thin film according to a present invention. This is based upon an advantage that the orientation of the ferroelectric thin film of the laminar perovskite structure expressed by the chemical structural formula:

$(AO)^{2+}(B_{y-1}C_yO_{3y+1})^{2-}$ (Chemical formula 8)

(wherein Y=2, 3, 4 or 5) can be easily controlled since the crystals grow predominantly in the direction of the plane a-b. In the ferroelectric elements, in general, it is preferable that the operating voltage is as low as 3 V or lower, from the standpoint of power consumption and operation speed. In the ferroelectric thin film according to the present invention, the coersive electric field is of the order of from several tens to 100 kV/cm. Therefore, the width of the ferroelectric thin film sandwiched by the electrodes is selected to be not larger than 0.3 $\mu$m to fabricate a ferroelectric element of their planar structure.

Figure 4A:
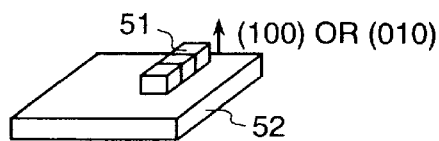
FIGS. 4A to 4D are diagrams schematically illustrating the crystal orientation of the ferroelectric thin film of the present invention.
Figure 4B:
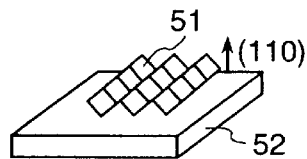
Figure 4C:
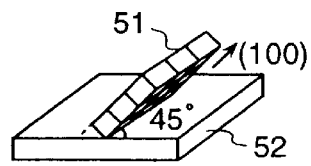
Figure 4D:
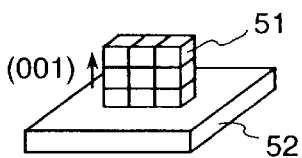

Even in the case of the ferroelectric element of the planar structure, a high spontaneous polarization can be obtained by effecting such control that the ferroelectric thin film is (100)-oriented, (010)-oriented, (110)-oriented, (001)-oriented or is so oriented that the c-axis of crystals is tilted at 45° as shown in FIG. 4C. The orientation and the magnitude of spontaneous polarization are as described above. To effectively obtain a spontaneous polarization value, it is preferable that the ferroelectric thin film has a ratio of (100)-orientation or (010)-orientation of at least not smaller than 70%. It is similarly preferable that the ferroelectric thin film has a ratio of (001)-orientation of not smaller than 70%, (110)-orientation of not smaller than 80%, and orientation in which the c-axis of crystals is tilted at 45° or not smaller than 90%.

Moreover, a ferroelectric thin film of a structure in which a blocking layer includes two Bi—O layers of the present invention represented by:

$(Bi_{2-x}A_xO_2)^{2+}(B_{y-1}C_yO_{3y+1})^{2-}$ (Chemical formula 9)

has a coersive electric field of the order of from several tens to 100 kV/cm. By determining the width of the ferroelectric thin film to be not larger than 0.3 μm, therefore, it is possible to obtain a ferroelectric element of a planar structure having a high spontaneous polarization.

In this case, furthermore, since the direction where the electric field is applied is perpendicular to the c-axis, a ferroelectric thin film that exhibits a high spontaneous polarization can be obtained by effecting such control that the (100)-orientation, (010)-orientation, (110)-orientation, (001)-orientation or orientation in which the c-axis of crystals is tilted at 45° is accomplished as shown in FIG. 4C. To obtain an effective spontaneous polarization value of the ferroelectric element, therefore, it is preferable that the ferroelectric thin film has a ratio of the (100)-orientation or the (010)-orientation of not smaller than 70%. It is similarly preferable that the ferroelectric thin film has a ratio of (001)-orientation of not smaller than 70%, (110)-orientation of not smaller than 80%, or orientation in which the c-axis of crystals is tilted at 45° of not smaller than 90%.

Figure 7:
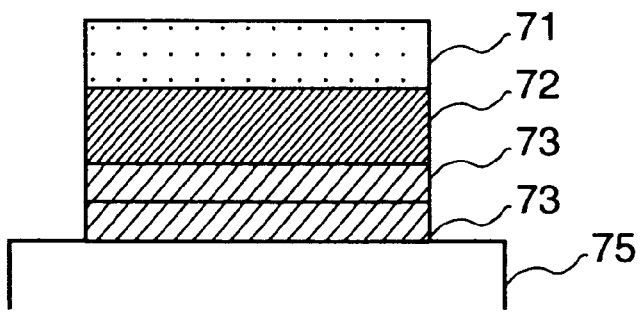
FIG. 7 is a sectional view illustrating the internal structure of a lower electrode of the present invention.

Next, in a generally employed constitution of the ferroelectric thin film of PZT and the lower electrode of Pt, Au or Al, oxygen of PZT diffuses into the electrode via the interface between the PZT and the electrode and, as a result, a transition layer is formed at the interface. Usually, the transition layer exhibits a small spontaneous polarization and a strong coersive electric field. The spontaneous polarization value drastically drops as the number of times of writing by inverting the electric field reaches the order of 108, and the coersive electric field increases. It is generally said that this is because, as the electric field is repetitively inverted, the destruction of crystals proceeds from the transition layer to the ferroelectric thin film. In the present invention, a structure shown in FIG. 7 is employed in order to suppress the deterioration of characteristics of the ferroelectric thin film in regard to spontaneous polarization and a coersive electric field. That is, the lower electrode is constituted by adopting a structure of an electrically conductive oxide of the perovskite structure, an electrically conductive oxide of a single element and a metal arranged in the order from the side in contact with the ferroelectric thin film, in order to suppress the diffusion of oxygen from the ferroelectric thin film and to not form a transition layer. Therefore, the characteristics of the ferroelectric element are not deteriorated even when the number of times of writing reaches the order of $10^{15}$.

Figure 8A:
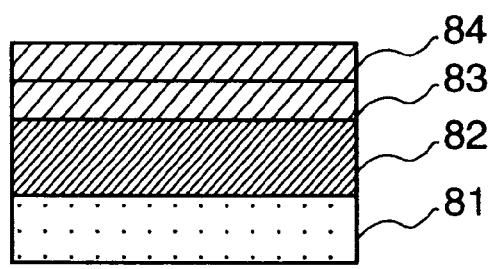
FIGS. 8A and 8B are sectional views illustrating the internal structure of an upper electrode of the present invention.
Figure 8B:
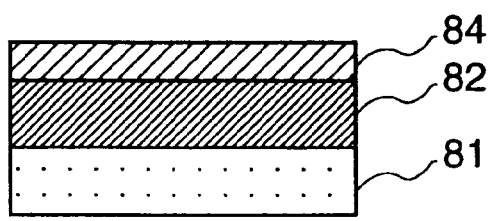

FIGS. 8A and 8B diagrams illustrating the constitution of the upper electrode according to the present invention. Like the case of the above-mentioned lower electrode, an electrically conductive oxide of the perovskite structure, an electrically conductive oxide of a single element, a metal or an electrically conductive oxide of the perovskite structure are formed in that order from the side in contact with the ferroelectric material in order to suppress the formation of the transition layer that stems from the diffusion of oxygen from the ferroelectric material into the electrode. It is thus possible to form a ferroelectric element which does not lose characteristics even when the number of times of writing reaches the order of $10^{15}$.

Even in a ferroelectric element of the planar structure, the right and left electrodes in contact with the ferroelectric thin film are made of an electrically conductive oxide of the perovskite structure or an electrically conductive oxide of a single element, so that the characteristics are not deteriorated even when the number of times of writing reaches the order of $10^{15}$.

The metal used for the upper and lower electrodes is a metal selected from the group consisting of Pt, Au, Al, Ni, Cr, Ti, Mo and W. Furthermore, the electrically conductive oxide of a single element used as the upper electrode, lower electrode, and right and left electrodes is an oxide of an element selected from the group consisting of Ti, V, Eu, Cr, Mo, W, Ph, Os, Ir, Pt, Re, Ru and Sn, and preferably has a resistivity of not larger than 1 mΩ·cm to exhibit the function of the electrode material. Moreover, the electrically conductive oxide of the perovskite structure is an oxide selected from the group consisting of $ReO_3$, $SrReO_3$, $BaReO_3$, $LaTiO_3$, $SrVO_3$, $CaCrO_3$, $SrCrO_3$, $SrFeO_3$, $La_{1-x}Sr_xCoO_3$ (0<x<0.5), $LaNiO_3$, $CaRuO_3$, $SrRuO_3$, $SrTiO_3$, and $BaPbO_3$, and preferably has a resistivity of not larger than 1 mΩ·cm for the electrode material.

In order to form a ferroelectric element that exhibits an optical response according to the present invention, it is necessary that a transparent electrically conductive oxide is used as the upper electrode in a structure as shown in FIG. 3. It is preferable that the transparent electrically conductive oxide is an oxide selected from the group consisting of $In_2O_3$, $Sn_2$, ZnO, ITO (In—Sn—O), ATO (Sb-doped Sn), FTO (F-doped Sn), and CTO (Cd—Sn—O), and having a transmission factor in a visible region of not smaller than 80% and a resistivity of not larger than 1 mΩ·cm.

Even in the planar structure shown in FIG. 6, similarly, either or both of the right and left electrodes may be made of an oxide selected from the group consisting of $In_2O_3$, $Sn_2$, ZnO, ITO (In—Sn—O), ATO (Sb-doped Sn), FTO (F-doped Sn), and CTO (Cd—Sn—O), and having a transmission factor in the visible region of not smaller than 80% and a resistivity of not larger than 1 mΩ·cm, which is necessary for obtaining a function as an electrode.

When the sputtering method is employed in accordance with the present invention, it is preferable that the ferroelectric thin film is produced in an atmosphere which necessarily contains oxygen gas under a reduced pressure at a temperature of not higher than 650° C. to suppress the reaction with the electrode material. The sputtering method gives an advantage that the ferroelectric thin film having uniform properties and a size of larger than 8 inches can be produced without an oxygen deficiency owing to the oxygen gas atmosphere. Even when a laser vaporization method is employed instead of the sputtering method, a ferroelectric thin film having uniform properties can be produced in an atmosphere of an oxygen gas or excited oxygen at a temperature of not higher than 650° C. By this laser vaporization method, a ferroelectric thin film having the same composition as the target can be formed making it easy to form a ferroelectric thin film having a complex composition. When an organic metal chemical vapor deposition method (MOCVD) is employed instead of the sputtering method, it is also possible to obtain a ferroelectric thin film having excellent properties like those mentioned above, giving advantage in regard to the coverage characteristics of a rough surface.

Even when the spin-coating method or the dip-coating method is employed using an metal alkoxide or an organic acid salt as a starting material, a ferroelectric thin film having uniform properties can be obtained at a forming temperature of not higher than 650° C. to suppress the reaction with the electrode material in the same manner as described above. The spin-coating method or the dip-coating method helps simplify the process of the synthesis under normal pressure.

According to the method of producing a ferroelectric thin film by the spin-coating method or the dip-coating method using an metal alkoxide or an organic acid salt as a starting material by use of irradiation with light, an ferroelectric thin film can be formed at a low temperature since the decomposition reaction of a complex due to the irradiation with light can be utilized as crystallization energy of the oxide.

A highly electrically conductive oxide of a single element or of the perovskite structure having uniform properties and a resistivity of not larger than 1 mΩ·cm can be formed by any one of various production methods like those described above.

Figure 9:
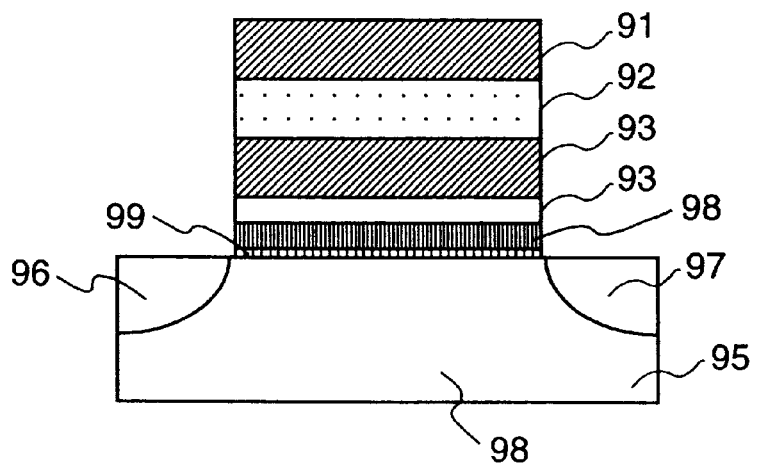
FIG. 9 is a sectional view illustrating a ferroelectric memory of the present invention.

FIG. 9 is a diagram illustrating the structure of a ferroelectric memory cell, wherein the ferroelectric element shown in FIG. 3 is formed on a semiconductor field effect transistor structure which comprises a source portion, a drain portion, polycrystalline Si and TiN which is a barrier layer. Remaining spontaneous polarization of the ferroelectric material makes it possible to control the conductance between the source region and the drain region.

Figure 10:
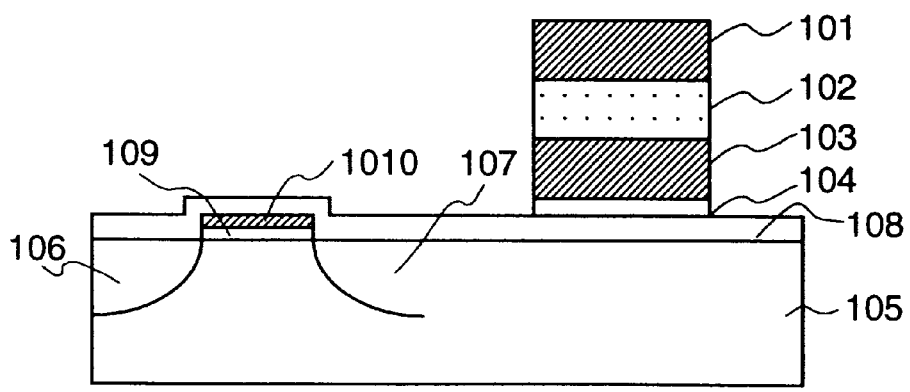
FIG. 10 is a sectional view illustrating the ferroelectric memory of the present invention.

FIG. 10 is a diagram illustrating the structure of a ferroelectric memory cell, wherein a MOS transistor comprising an oxide layer, a metal layer and an insulation layer, a capacitor and a ferro-electric element shown in FIG. 3, are formed on the above-mentioned semiconductor field effect transistor. This structure has an advantage that the difference in the spontaneous polarization caused by the inversion of an electric field can be detected by use of a residual component which is twice in magnitude.

Figure 11:
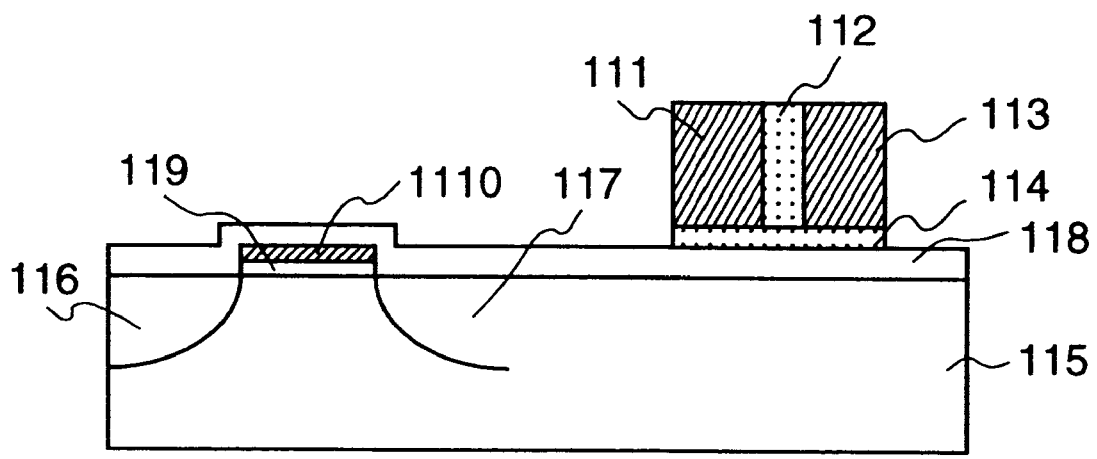
FIG. 11 is a sectional view illustrating the ferroelectric memory of the present invention.

FIG. 11 illustrates a structure in which the planar type ferroelectric element shown in FIG. 6 is used instead of the ferroelectric element shown in FIG. 3. Even in this case, the difference in the spontaneous polarization resulting from the inversion of an electric field can be advantageously detected by use of a residual component which is twice in magnitude.

Next, the ferroelectric thin films having crystalline structures shown in FIGS. 1 and 2 can be advantageously used as an infrared ray sensor because of their large change in the spontaneous polarization with respect to a change in the temperature. This is because the large pyroelectric coefficient (dPr/dt: Pr represents spontaneous polarization) that is necessary for the detection by the infrared ray sensor is large.

The ferroelectric element having the electrode made of a transparent electrically conductive oxide produced according to the present invention is capable of generating a voltage in tune with oscillation of light pulses of the order of $\mu s$ or shorter, and can be effectively utilized for developing an optical response system that also can measure the light reflection.

The ferroelectric memory cell produced according to the present invention operates at a decreased voltage and has a large residual polarization, and can be effectively used for developing a non-contact type read or write memory by combining a plurality of cells.

Embodiments of the invention will now be described with reference to the drawings to which, however, the invention is in no way limited.

(Embodiment 1)

FIG. 1 illustrates the crystalline structure of a ferroelectric thin film used in the present invention having a chemical structural formula:

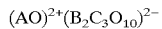  (Chemical formula 10)

There will be described below a production method of when A=element Nd, B=element Sr and C=element Ta in the above chemical structural formula. In FIG. 3 which is a sectional view of a ferroelectric element, reference numeral 34 denotes an underlying substrate. First, the underlying substrate was made of Si including a TiN barrier layer of a thickness of 2000 Å formed by heating. Next, a lower electrode 33 was formed on the underlying substrate 34. The lower electrode was constituted, as shown in FIG. 7, by a metal 74, an electrically conductive oxide 73 of a single element and an electrically conductive oxide 72 of a perovskite structure. On the underlying substrate 34 was formed a metal Ru 74 having a thickness of 1000 Å by sputtering while being heated at 600° C., followed by the formation of the electrically conductive oxide RuO 73 of a single element having a thickness of 1000 Å by sputtering in an oxygen gas atmosphere at 450° C. and the electrically conductive oxide $SrRuO_3$ 72 of the perovskite structure by sputtering at a temperature of 650° C. The lower electrode 33 was spin-coated with a metal alkoxide solution of Nd, Sr or Ta at 1500 rpm for 30 s in order to form the ferroelectric thin film 32 thereon. Then, drying was effected at 150° C. for 5 min, and pre-heat treatment was effected in the air or oxygen for 10–30 min at a temperature over a range of from 200° C. to 550° C. which is lower than the crystallization temperature of 500° C. of the ferroelectric thin film. The above-mentioned operations were repeated two to five times to form a thin film precursor having a thickness of 2500 Å. Finally, the heat treatment was effected at 580° C. to 650° C. to obtain a ferroelectric thin film:

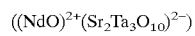  (Chemical formula 11)

As a result of X-ray diffraction, it was found that the ferroelectric thin film was so oriented that the c-axis was tilted at 45°. Performing a pole figure measurement using a diffraction peak of a plane (105), furthermore, it was found that the degree of orientation was 93%. Next, the upper electrode 31 was formed on the ferroelectric thin film 32. The upper electrode 31 was constituted, as shown in FIG. 8(a), by an electrically conductive oxide 82 of the perovskite structure, an electrically conductive oxide 83 of a single element and a metal 84. On the ferroelectric thin film 32:

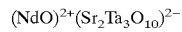  (Chemical formula 12)

was formed the electrically conductive oxide $SrRuO_3$ 82 of the perovskite structure having a thickness of 1000 Å by sputtering in an oxygen gas atmosphere at a temperature of 650° C., followed by the formation thereon of the electrically conductive oxide RuO 83 of a single element having a thickness of 1000 Å by sputtering in an oxygen gas atmosphere at 450° C. and a metal Ru 84 having a thickness of 1000 Å by sputtering at 600° C. The spontaneous polarization (Pr) and coersive electric field (Ec) of the thus obtained ferroelectric element were measured at room temperature and they were 20 $\mu C/cm^2$ and 75 kV/cm, respectively. Measurement was repeated by inverting a voltage of 280 kV/cm, but Pr characteristics were not deteriorated up to $10^{12}$ times (Table 1).

The thus obtained lower electrode of Ru, RuO, $SrRuO_3$ and, particularly, of $SrRuO_3$ can be oriented along the a-axis by contriving the step of forming the film by sputtering. By utilizing the thus oriented face and by contriving the steps of spin coating, drying and heat treatment, it is possible to obtain, as shown in FIG. 4A, a (100)- or (010)-orientation, FIG. 4B a (110)-orientation, FIG. 4C orientation in which the c-axis is tilted at 45°, or FIG. 4D a (001)-orientation. The relationships between the degree of orientation and Pr, Ec, when the orientation degree was 70%, were (a) Pr=17 to 20 $\mu C/cm^2$ and Ec=70 to 90 kV/cm in the case of the (100)- or (010)-orientation, (b) Pr=15 to 18 $\mu C/cm^2$ and Ec=60 to 90 kV/cm in the case of the (110)-orientation, (c) Pr=13 to 16 $\mu C/cm^2$ and Ec=60 to 90 kV/cm in the case of the orientation where the c-axis was tilted at 45°, and (d) Pr=17 to 20 $\mu$C/cm$^2$ and Ec=70 to 90 kV/cm in the case of the (001)-orientation.

Table 1 also shows Pr, Ec and the number of times of writing of the ferroelectric element of which the c-axis is tilted at 45° obtained in the same manner as described above by using any one of the elements Ti, Nb, W, Mo, Fe, Co, Cr or Zr for the C-site in the chemical structural formula:

$$(NdO)^{2+}(Sr_2C_3O_{10})^{2-} \qquad \text{(Chemical formula 13)}$$

TABLE 1

| c-cite | Ti | Nb | Ta | W |
|---|---|---|---|---|
| Pr ($\mu$C/cm$^2$) | 19 | 18 | 20 | 19 |
| Ec (kV/cm) | 75 | 80 | 75 | 80 |
| The number of times of writing | 1.00E+13 | 1.00E+13 | 1.00E+12 | 1.00E+12 |

| Zr | Mo | Fe | Co | Cr |
|---|---|---|---|---|
| 18 | 19 | 20 | 20 | 20 |
| 80 | 82 | 73 | 70 | 75 |
| 1E-14 | 1.00E+13 | 1.00E+14 | 1.00E+14 | 1.00E+13 |

Table 2 shows Pr, Ec and the number of times of writing of the ferroelectric element of which the c-axis is tilted at 45° obtained in the same manner as described above by using any one of the elements Ti, Nb, Ta, W, Mo, Fe, Co, Cr and Zr for the C-site in the chemical structural formula:

$$(TlO)^{2+}(Sr_2C_3O_{10})^{2-} \qquad \text{(Chemical formula 14)}$$

TABLE 2

| c-cite | Ti | Nb | Ta | W |
|---|---|---|---|---|
| Pr ($\mu$C/cm$^2$) | 18 | 17 | 18 | 20 |
| Ec (kV/cm) | 80 | 90 | 85 | 80 |
| The number of times of writing | 1.00E+13 | 1.00E+12 | 1.00E+13 | 1.00E+13 |

| Zr | Mo | Fe | Co | Cr |
|---|---|---|---|---|
| 18 | 19 | 20 | 20 | 20 |
| 80 | 82 | 73 | 71 | 72 |
| 1E-13 | 1.00E+12 | 1.00E+13 | 1.00E+13 | 1.00E+14 |

Table 3 shows Pr, Ec and number of times of writing of the ferroelectric element of which the c-axis is tilted at 45° obtained in the same manner as described above by: using any one of the elements Ti, Nb, Ta, W, Mo, Fe, Co, Cr and Zr for the C-site in the chemical structural formula $$(HgO)^{2+}(Sr_2C_3O_{10})^{2-} \qquad \text{(Chemical formula 15)}$$

TABLE 3

| c-cite | Ti | Nb | Ta | W |
|---|---|---|---|---|
| Pr ($\mu$C/cm$^2$) | 18 | 18 | 18 | 19 |
| Ec (kV/cm) | 78 | 90 | 90 | 82 |
| The number of times of writing | 1.00E+12 | 1.00E+12 | 1.00E+12 | 1.00E+13 |

| Zr | Mo | Fe | Co | Cr |
|---|---|---|---|---|
| 18 | 19 | 20 | 20 | 20 |
| 82 | 83 | 71 | 70 | 70 |
| 1E-14 | 1.00E+12 | 1.00E+13 | 1.00E+14 | 1.00E+14 |

Table 4 shows Pr, Ec and the number of times of writing of the ferroelectric element of which the c-axis is tilted at 45° obtained in the same manner as described above by using any one of the elements Ti, Nb, Ta, W, Mo, Fe, Co, Cr and Zr for the C-site in the chemical structural formula:

$$(YO)^{2+}(Sr_2C_3O_{10})^{2-} \qquad \text{(Chemical formula 16)}$$

TABLE 4

| c-cite | Ti | Nb | Ta | W |
|---|---|---|---|---|
| Pr ($\mu$C/cm$^2$) | 19 | 17 | 18 | 19 |
| Ec (kV/cm) | 77 | 95 | 88 | 82 |
| The number of times of writing | 1.00E+14 | 1.00E+12 | 1.00E+12 | 1.00E+14 |

| Zr | Mo | Fe | Co | Cr |
|---|---|---|---|---|
| 18 | 19 | 19 | 20 | 19 |
| 81 | 79 | 80 | 75 | 75 |
| 1E-14 | 1.00E+12 | 1.00E+13 | 1.00E+14 | 1.00E+13 |

Table 5 shows Pr, Ec and the number of times of writing of the ferroelectric element of which the c-axis is tilted at 45° obtained in the same manner as described above by using any one of the elements Ti, Nb, Ta, W, Mo, Fe, Co, Cr and Zr for the C-site in the chemical structural formula:

$$(CeO)^{2+}(Sr_2C_3O_{10})^{2-} \qquad \text{(Chemical formula 17)}$$

TABLE 5

| c-cite | Ti | Nb | Ta | W |
|---|---|---|---|---|
| Pr ($\mu$C/cm$^2$) | 18 | 16 | 18 | 19 |
| Ec (kV/cm) | 85 | 95 | 90 | 98 |
| The number of times of writing | 1.00E+13 | 1.00E+12 | 1.00E+12 | 1.00E+12 |

| Zr | Mo | Fe | Co | Cr |
|---|---|---|---|---|
| 18 | 19 | 20 | 18 | 19 |
| 82 | 100 | 80 | 78 | 82 |
| 1E-12 | 1.00E+12 | 1.00E+13 | 1.00E+14 | 1.00E+13 |

It is further possible to obtain a ferroelectric element having Pr=16 to 20 $\mu$C/m$^2$, Ec=70 to 100 kV/cm and a number of times of writing of the order of $10^{12}$ or larger in the same manner as described above even by using any one of the elements Tl, Hg, Y, Ce, Pr, Nd, Pm, Eu, Gd, Tb, Dy, Ho, Er, Tm, Yb and Lu for the A-site, by using at least one or more of the elements Bi, Pb, Ca, Sr and Ba for the B-site, and by using at least one or more of the elements Ti, Nb, Ta, W, Mo, Fe, Co, Cr and Zr for the C-site in the chemical structural formula:

$$(AO)^{2+}(B_2C_3O_{10})^{2-} \qquad \text{(Chemical formula 18)}$$

It is further possible to obtain a ferroelectric element having Pr=16 to 19 $\mu$C/cm$^2$, Ec=70 to 100 kV/cm and a number of times of writing of the order of $10^{12}$ or larger in the same manner as described above even by using any one of the elements La and Sm for the A-site, by using at least one or more of the elements Bi, Ca, Sr and Ba for the B-site, and by using at least one or more of the elements Ti, Nb, Ta, W, Mo, Fe, Co, Cr and Zr for the C-site in the chemical structural formula:

$$(AO)^{2+}(B_2C_3O_{10})^{2-} \qquad \text{(Chemical formula 19)}$$

It is further possible to obtain a ferroelectric element having Pr=16 to 20 $\mu$C/cm$^2$, Ec=70 to 100 kV/cm and a number of times of writing of the order of $10^{12}$ or larger in the same manner as described above even by using at least one or more of the elements Ca, Sr and Ba for the B-site, and by using at least one or more of the elements Ti, Nb, Ta, W, Mo, Fe, Co, Cr and Zr for the C-site in the chemical structural formula:

$$(PbO)^{2+}(B_2C_3O_{10})^{2-} \quad \text{(Chemical formula 20)}$$

It is further possible to obtain a ferroelectric element having Pr=16 to 20 $\mu C/cm^2$, Ec=70 to 100 kV/cm and a number of times of writing of the order of $10^{12}$ or larger in the same manner as described above by using the same elements as those mentioned above for the A-site, B-site and C-site in the chemical structural formula:

$$(AO)^{2+}(B_1C_2O_7)^{2-}$$

$$(AO)^{2+}(B_3C_4O_{13})^{2-}$$

$$(AO)^{2+}(B_4C_5O_{16})^{2-} \quad \text{(Chemical formula 21)}$$

Though Table 1 shows the data of the case (c) where the c-axis was tilted at 45°, it is possible to obtain a ferroelectric element of which the Pr value is increased by about 1.1 times compared with that of (c) in the case of (a) (100)- or (010)-orientation, increased by about 1.05 times compared with that of (c) in the case of (B) (110)-orientation, and increased by about 1.1 times compared with that of (c) in the case of (d) (001)-orientation.

(Embodiment 2)

FIG. 2 illustrates the crystalline structure of a ferroelectric thin film used in the present invention having a chemical structural formula:

$$(Bi_{2-x}A_xO_2)^{2+}(B_2C_3O_{10})^{2-} \quad \text{(Chemical formula 22)}$$

The lower electrode was formed in the same manner as in Embodiment 1 even in the case of A=element Sb, B=element Sr, C=element Ta and x=0.4 in the above chemical structural formula. The lower electrode was spin-coated with a metal alkoxide solution of Bi, Sb, Sr or Ta at 1500 rpm for 30 s in order to form the ferroelectric thin film thereon. Then, drying was effected at 150° C. for 5 min, and pre-heat treatment was effected for 10–30 min in the air or oxygen at a temperature over a range of from 350° C. to 550° C. which was lower than the crystallization temperature of 580° C. of the ferroelectric thin film. The above-mentioned operations were repeated two to five times to form a thin film precursor having a thickness of 2500 Å. Finally, the heat treatment was effected at 580° to 650° C. to obtain a ferroelectric thin film, $$(Bi_{1.6}Sb_{0.4}O_2)^{2+}(Sr_2Ta_3O_{10})^{2-} \quad \text{(Chemical formula 23)}$$

As a result of X-ray diffraction, it was found that the ferroelectric thin film was so oriented that the c-axis was tilted at 45°. Performing a pole figure measurement using a diffraction peak of a plane (105), furthermore, it was found that the degree of orientation was 90%. Next, the upper electrode was formed on the ferroelectric thin film in the same manner as in the embodiment 1. The spontaneous polarization (Pr) and electric field (Ec) of the thus obtained ferroelectric element were measured at room temperature and they were 18 $\mu C/cm^2$ and 90 kV/cm, respectively. Measurement was repeated by inverting a voltage of 280 kV/cm, but Pr characteristics were not deteriorated up to $10^{14}$ times (Table 6). Even when the degree of substitution of the element A for the Bi-site was changed over in a range of 0<x<2, a ferroelectric element having Pr=18 to 19 $\mu C/cm^2$, Ec=90 to 100 kV/cm and a number of times of writing of the order of $10^{14}$ could be obtained through the same method as the one mentioned above.

The thus obtained lower electrode of Ru, RuO, $SrRuO_3$ and, particularly, of $SrRuO_3$ can be oriented along the a-axis by contriving the step of forming the film by sputtering. By utilizing the thus oriented plane and by contriving the steps of spin coating, drying and heat treatment, it is possible to obtain, as shown in FIG. 5, (a) (100)- or (010)-orientation, (b) (110)-orientation, or (c) orientation in which the c-axis is tilted at 45°. The relationships between the degree of orientation and Pr, Ec, when the orientation degree was 70%, were (a) Pr=17 to 20 $\mu C/cm^2$ and Ec=70 to 90 kV/cm in the case of (100)- or (010)-orientation, (b) Pr=15 to 18 $\mu C/cm^2$ and Ec=60 to 90 kV/cm in the case of (110)-orientation and (c) Pr=13 to 16 $\mu C/cm^2$ and Ec=60 to 90 kV/cm in the case of orientation where the c-axis was tilted at 45°.

Table 6 also shows Pr, Ec and a number of times of the writing of ferroelectric element obtained in the same manner as described above by using any one of the elements Ti, Nb, W, Mo, Fe, Co, Cr or Zr for the C-site in the chemical structural formula:

$$(Bi_{2-x}Sb_xO_2)^{2+}(Sr_2C_3O_{10})^{2-} \quad \text{(Chemical formula 24)}$$

TABLE 6

| c-cite | Ti | Nb | Ta | W |
|---|---|---|---|---|
| Pr ($\mu C/cm^2$) | 19 | 16 | 18 | 19 |
| Ec (kV/cm) | 85 | 100 | 90 | 85 |
| The number of times of writing | 1.00E+14 | 1.00E+13 | 1.00E+14 | 1.00E+14 |
| Zr | Mo | Fe | Co | Cr |
| 18 | 19 | 20 | 20 | 20 |
| 80 | 85 | 75 | 70 | 75 |
| 1.00E−14 | 1.00E+14 | 1.00E+14 | 1.00E+14 | 1.00E+14 |

It is further possible to obtain a ferroelectric element having Pr=16 to 20 $\mu C/cm^2$, Ec=70 to 100 kV/cm and a number of times of writing of the order of $10^{13}$ or larger in the same manner as described above even by using at least two or more of the elements Ti, Nb, Ta, W, Mo, Fe, Co, Cr and Zr in combination for the C-site in the chemical structural formula:

$$(Bi_{2-x}Sb_xO_2)^{2+}(Sr_2C_3O_{10})^{2-} \quad \text{(Chemical formula 25)}$$

Table 7 shows Pr, Ec and the number of times of writing of the ferroelectric element obtained in the same manner described above by using any one of the elements Ti, Nb, Ta, W, Mo, Fe, Co, Cr and Zr for the C-site in the chemical structural formula:

$$(Bi_{2-x}Hg_xO_2)^{2+}(Sr_2C_3O_{10})^{2-} \quad \text{(Chemical formula 26)}$$

TABLE 7

| c-cite | Ti | Nb | Ta | W |
|---|---|---|---|---|
| Pr ($\mu C/cm^2$) | 18 | 17 | 18 | 20 |
| Ec (kV/cm) | 80 | 100 | 100 | 85 |
| The number of times of writing | 1.00E+13 | 1.00E+13 | 1.00E+14 | 1.00E+13 |
| Zr | Mo | Fe | Co | Cr |
| 18 | 19 | 20 | 20 | 20 |
| 85 | 90 | 74 | 70 | 72 |
| 1E−14 | 1.00E+14 | 1.00E+14 | 1.00E+14 | 1.00E+14 |

It is further possible to obtain a ferroelectric element having Pr=15 to 19 $\mu C/cm^2$, Ec=75 to 100 kV/cm and a number of times of writing of the order of $10^{13}$ or larger in the same manner as described above even by using at least two or more of the elements Ti, Nb, Ta, W, Mo, Fe, Co, Cr and Zr in combination for the C-site in the chemical structural formula:

$$(Bi_{2-x}Hg_xO_2)^{2+}(Sr_2C_3O_{10})^{2-} \quad \text{(Chemical formula 27)}$$

Table 8 shows Pr, Ec and a number of times of writing of the ferroelectric element obtained in the same manner as described above by using any one of the elements Ti, Nb, Ta, W, Mo, Fe, Co, Cr and Zr for the C-site in the chemical structural formula:

$$(Bi_{2-x}As_xO_2)^{2+}(Sr_2C_3O_{10})^{2-} \quad \text{(Chemical formula 28)}$$

TABLE 8

| c-cite | Ti | Nb | Ta | W |
|---|---|---|---|---|
| Pr ($\mu C/cm^2$) | 19 | 18 | 18 | 20 |
| Ec (kV/cm) | 80 | 95 | 95 | 85 |
| The number of times of writing | 1.00E+14 | 1.00E+14 | 1.00E+14 | 1.00E+14 |
| Zr | Mo | Fe | Co | Cr |
| 17 | 19 | 20 | 20 | 20 |
| 80 | 85 | 74 | 70 | 70 |
| 1E–14 | 1.00E+14 | 1.00E+14 | 1.00E+14 | 1.00E+14 |

It is further possible to obtain a ferroelectric element having Pr=17 to 20 $\mu C/cm^2$, Ec=80 to 100 kV/cm and a number of times of writing of the order of $10^{13}$ or larger in the same manner as described above even by using at least two or more of the elements Ti, Nb, Ta, W, Mo, Fe, Co, Cr and Zr in combination for the C-site in the chemical structural formula:

$$(Bi_{2-x}As_xO_2)^{2+}(Sr_2C_3O_{10})^{2-} \quad \text{(Chemical formula 29)}$$

Table 9 shows Pr, Ec and a number of times of writing of the ferroelectric element obtained in the same manner as described above by using any one of the elements Ti, Nb, Ta, W, Mo, Fe, Co, Cr and Zr for the C-site in the chemical structural formula:

TABLE 9

| c-cite | Ti | Nb | Ta | W |
|---|---|---|---|---|
| Pr($\mu C/cm^2$) | 18 | 17 | 18 | 19 |
| Ec(kV/cm) | 80 | 100 | 95 | 90 |
| The number of times of writing | 1.00E + 14 | 1.00E + 14 | 1.00E + 14 | 1.00E + 14 |
| Zr | Mo | Fe | Co | Cr |
| 17 | 19 | 20 | 20 | 20 |
| 80 | 85 | 74 | 70 | 70 |
| 1E – 14 | 1.00E + 14 | 1.00E + 13 | 1.00E + 14 | 1.00E + 14 |

It is further possible to obtain a ferroelectric element having Pr=17 to 20 $\mu C/cm^2$, Ec=80 to 100 kV/cm and a number of times of writing of the order of $10^{12}$ or larger in the same manner as described above even by using at least two or more of the elements Ti, Nb, Ta, W, Mo, Fe, Co, Cr and Zr in combination for the C-site in the chemical structural formula:

$$(Bi_{2-x}Tl_xO_2)^{2+}(Sr_2C_3O_{10})^{2-} \quad \text{(Chemical formula 31)}$$

It is further possible to obtain a ferroelectric element having Pr=16 to 20 $\mu C/cm^2$, Ec=70 to 100 kV/cm and a number of times of writing of the order of $10^{12}$ or larger in the same manner as described above even by using at least one of the elements Tl, Hg, Sb and As for the A-site, at least one or more of Bi, Pb, Ca, Sr, Ba, Y and rare earth elements for the B-site, and at least one or more of the elements Ti, Nb, Ta, W, Mo, Fe, Co, Cr and Zr for the C-site in the chemical structural formula:

$$(Bi_{2-x}A_xO_2)^{2+}(B_2C_3O_{10})^{2-} \quad \text{(Chemical formula 32)}$$

Table 10 shows Pr, Ec and a number of times of writing of the ferroelectric element obtained in the same manner as described above by using any one of the elements Ti, Nb, Ta, W, Mo, Fe, Co, Cr and Zr for the C-site in the chemical structural formula:

$$(Bi_{2-x}Pb_xO_2)^{2+}(Sr_2C_3O_{10})^{2-} \quad \text{(Chemical formula 33)}$$

TABLE 10

| c-cite | Ti | Nb | Ta | W |
|---|---|---|---|---|
| Pr($\mu C/cm^2$) | 17 | 16 | 17 | 18 |
| Ec(kV/cm) | 90 | 100 | 95 | 100 |
| The number of times of writing | 1.00E + 14 | 1.00E + 14 | 1.00E + 14 | 1.00E + 14 |
| Zr | Mo | Fe | Co | Cr |
| 18 | 19 | 19 | 18 | 18 |
| 80 | 100 | 85 | 85 | 90 |
| 1E – 13 | 1.00E + 14 | 1.00E + 13 | 1.00E + 14 | 1.00E + 14 |

It is further possible to obtain a ferroelectric element having Pr=16 to 20 $\mu C/cm^2$, Ec=75 to 100 kV/cm and the number of times of writing of the order of $10^{12}$ or larger in the same manner as described above even by using at least two or more of the elements Ti, Nb, Ta, W, Mo, Co and Cr in combination for the C-site in the chemical structural formula:

$$(Bi_{2-x}Pb_xO_2)^{2+}(Sr_2C_3O_{10})^{2-} \quad \text{(Chemical formula 34)}$$

It is further possible to obtain a ferroelectric element having Pr=16 to 20 $\mu C/cm^2$, Ec=70 to 100 kV/cm and a number of times of writing of the order of $10^{12}$ or larger in the same manner as described above even by using at least one of elements Bi, Pb, Ca, Sr, Ba, Y and rare earth elements for the B-site and any one of Ti, Nb, Ta, W, Mo, Fe, Co, Cr and Zr for the C-site in the chemical structural formula:

$$(Bi_{2-x}Pb_xO_2)^{2+}(B_2C_3O_{10})^{2-} \quad \text{(Chemical formula 35)}$$

It is further possible to obtain a ferroelectric element having Pr=17 to 20 $\mu C/cm^2$, Ec=70 to 100 kV/cm and a number of times of writing of the order of $10^{12}$ or larger in the same manner as described above even by using at least one or more of Bi, Pb, Ca, Sr, Ba, Y and rare earth elements for the B-site and at least two or more of Ti, Nb, Ta, W, Mo, Co and Cr in combination for the C-site in the chemical structural formula:

$$(Bi_{2-x}Pb_xO_2)^{2+}(B_2C_3O_{10})^{2-} \quad \text{(Chemical formula 36)}$$

It is further possible to obtain a ferroelectric element having Pr=16 to 20 $\mu C/cm^2$, Ec=70 to 100 kV/cm and a number of times of writing of the order of $10^{13}$ or larger in the same manner as described above by using the same elements as those mentioned above in combination for the A-site, B-site and C-site in the chemical structural formula:

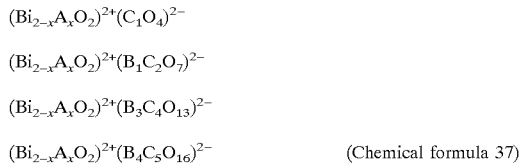
(Chemical formula 37)

Though Table 6 shows the data of the case (c) where the c-axis was tilted at 45°, it is possible to obtain a ferroelectric element of which the Pr value is increased by about 1.1 times compared with that of (c) in the case of. (a) (100)- or (010)-orientation, and is increased by about 1.05 times compared with that of (c) in the case of (b) (110)-orientation.
(Embodiment 3)

FIG. 6 is a sectional view of a ferroelectric element of an embodiment according to the present invention. In FIG. 6, a ferroelectric element of the planar type is equipped with a left electrode 61 and a right electrode 63 on both sides of a ferro-electric thin film 62 on an underlying substrate 64. First, a ferroelectric thin film:

$(Bi_{1.6}Sb_{0.4}O_2)^{2+}(Sr_2Ta_3O_{10})^{2-}$ (Chemical formula 38)

having a thickness of 2000 Å of which the c-axis was tilted at 45° was formed in the same manner as in embodiment 2 on the underlying substrate that includes a 2000 Å-thick TiN barrier layer formed in the embodiment 1. Next, the width of the ferroelectric thin film was adjusted to 0.3 μm by a mask patterning method, and an electrically conductive substrate $SrRuO_3$ of the perovskite structure was formed to a thickness of 2500 Å on both sides of the ferroelectric thin film by sputtering in an oxygen gas atmosphere at a temperature of 650° C. to form a left electrode 61 and a right electrode 63. The spontaneous polarization (Pr) and coersive electric field (Ec) of the thus obtained ferroelectric element were measured at room temperature, and they were 17 μC/cm² and 100 kV/cm, respectively. Furthermore, the number of times of repetition was measured by inverting a voltage of 280 kV/cm, but the Pr characteristics were not deteriorated up to $10^{14}$ times. Even when the degree of substitution of the element Pb for the Bi-site was changed over in a range of 0<Å<2, the ferroelectric element having Pr=18 to 19 μC/cm², Ec=of 90 to 100 kV/cm and the number of times of writing of the order of $10^{14}$ could be obtained through the same method as the one mentioned above.

An electrically conductive oxide RuO of a single element of a thickness of 2500 Å was formed by sputtering in an oxygen gas atmosphere at a temperature of 650° C. on both sides of the ferroelectric thin film having a width of 0.3 μm obtained above in order to form the left electrode 61 and the right electrode 63. The values Pr and E of the thus obtained ferroelectric element were measured at room temperature and they were 17 μC/cm² and 100 kV/cm, respectively. The number of times of repetition was also measured by inverting a voltage of 280 kV/cm, but the Pr characteristics were not deteriorated even in the order of $10^{13}$.

Even when a ferroelectric thin film of a chemical structural formula:

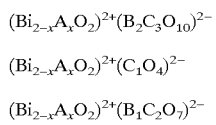

(Chemical formula 39)

was used in place of the above-mentioned ferroelectric thin film, a ferroelectric element having Pr=16 to 20 μC/cm², Ec=70 to 100 kV/cm and a number of times of writing of the order of $10^{12}$ or larger could be obtained through the same method by using the same elements as those of the embodiment 1 for the A-site, B-site and C-site.

By contriving the steps of spin-coating, drying and heat treatment (and particularly forming temperature), the ferroelectric thin film can be (a)(100)-oriented or (010)-oriented, (b) (110)-oriented, (c) oriented such that the c-axis is tilted at 45°, and (d) (001)-oriented as shown in FIG. 4. Compared to the case (c) where the c-axis is tilted at 45°, the ferroelectric element exhibits a Pr which is increased by about 1.1 times in the cases (a) and (d) and is increased by about 1.05 times in the case (b).

Furthermore, a ferroelectric thin film:

$(NdO)^{2+}(Sr_2Ta_3O_{10})^{2-}$ (Chemical formula 40)

having a thickness of 2000 Å of which the c-axis was tilted at 45° was formed in the same manner as in the embodiment 1 on the underlying substrate that includes a 2000 Å-thick TiN barrier layer formed in the embodiment 1. Next, the width of the ferroelectric thin film was adjusted to 0.3 μm by a mask patterning method, and an electrically conductive oxide $SrRuO_3$ of the perovskite structure was formed to a thickness of 2500 Å on both sides of the ferroelectric thin film by sputtering in an oxygen gas atmosphere at a temperature of 650° C. to form a left electrode and a right electrode. The Pr and Ec of the thus obtained ferroelectric element was measured at room temperature, and they were 19 μC/cm² and 70 kV/cm, respectively. Furthermore, the number of times of repetition was measured by inverting a voltage of 280 kV/cm, but the Pr characteristics were not deteriorated up to $10^{12}$ times.

Even when a ferroelectric thin film of a chemical structural formula:

(Chemical formula 41)

was used in place of the above-mentioned ferroelectric thin film, a ferroelectric element having Pr=16 to 20 μC/cm², Ec=70 to 100 kV/cm and a number of times of writing of the order of $10^{12}$ or larger could be obtained through the same method by using the same elements as those of the embodiment 2 for the A-site, B-site and C-site.

By contriving the steps of spin-coating, drying and heat treatment (and particularly forming temperature), the ferroelectric thin film can be (a) (100)-oriented or (010)-oriented, (b) (110)-oriented, (c) oriented such that the c-axis is tilted at 45°, (d) and (001)-oriented as shown in FIG. 5. Compared to the case (c) where the c-axis is tilted at 45°, the ferroelectric element exhibits a Pr which is increased by about 1.1 times, by about 1.05 times and by about 1.1 times in the cases (a), (b) and (d).
(Embodiment 4)

FIG. 7 illustrates the internal constitution of the lower electrode according to the present invention. Like the embodiment 1, first, a metal 74 of any one of Pt, Au, Al, Ni, Cr, Ti, Mo and W was formed by sputtering to a thickness of 1000 Å on the underlying substrate 75 at a temperature of 600° C. Then, there was formed an electrically conductive oxide 73 of a single element of any one of $TiO_x$, $VO_x$, EuO, $CrO_2$, $MoO_2$, $WO_2$, PhO, OsO, IrO, PtO, $ReO_2$, $RuO_2$ and $SnO_2$ maintaining a thickness of 1000 Å by sputtering in an oxygen gas atmosphere at 450° C. Then, finally, there was formed an electrically conductive oxide 72 of the perovskite structure of any one of $ReO_3$, $SrReO_3$, $BaReO_3$, $LaTiO_3$, $SrVO_3$, $CaCrO_3$, $SrCrO_3$, $SrFeO_3$, $La_{1-x}Sr_xCoO_3$ (0<x<0.5), $LaNiO_3$, $CaRuO_3$, $SrRuO_3$, $SrTiO_3$, and $BaPbO_3$ by sputtering at 650° C. to a thickness of 1000 Å. Next, on the thus obtained lower electrode was formed a ferroelectric thin film obtained in the embodiment 1.

Then, the upper electrode of FIG. 8(*a*) of the present invention was formed by the method mentioned below. Like the embodiment 1, a ferroelectric element was obtained by forming an electrically conductive oxide 82 of the perovskite structure of any one of $ReO_3$, $SrReO_3$, $BaReO_3$, $LaTiO_3$, $SrVO_3$, $CaCrO_3$, $SrCrO_3$, $SrFeO_3$, $La_{1-x}Sr_xCoO_3$ (0<x<0.5), $LaNiO_3$, $CaRuO_3$, $SrRuO_3$, $SrTiO_3$, and $BaPbO_3$ having a thickness of 1000 Å by sputtering at a temperature of 650° C. in an oxygen gas atmosphere, an electrically conductive oxide 83 of a single element of any one of $TiO_x$, $VO_x$, EuO, $CrO_2$, $MoO_2$, $WO_2$, PhO, OsO, IrO, PtO, $ReO_2$, $RuO_2$ and $SnO_2$ having a thickness of 1000 Å by sputtering in an oxygen gas atmosphere at 450° C., and an upper electrode of a metal 84 of any one of Pt, Au, Al, Ni, Cr, Ti, Mo and W having a thickness of 1000 Å by sputtering at 600° C. The thus obtained ferroelectric element exhibited Pr of 16 to 20 $\mu C/cm^2$, Ec of 70 to 100 kV/cm and a number of times of writing of the order of $10^{12}$ or larger.

After the lower electrode and the ferroelectric thin film were formed by the same methods as those mentioned above, the upper electrode of FIG. 8(*b*) of the present invention was formed by a method described below. Like the embodiment 1, a ferroelectric element was obtained by forming an electrically conductive oxide 82 of the perovskite structure of any one of $ReO_3$, $SrReO_3$, $BaReO_3$, $LaTiO_3$, $SrVO_3$, $CaCrO_3$, $SrCrO_3$, $SrFeO_3$, $La_{1-x}Sr_xCoO_3$ (0<x<0.5), $LaNiO_3$, $CaRuO_3$, $SrRuO_3$, $SrTiO_3$ and $BaPbO_3$ having a thickness of 1000 Å by sputtering in an oxygen gas atmosphere at a temperature of 650° C. and an upper electrode of a metal 84 of any one of Pt, Au, Al, Ni, Cr, Ti, Mo and W by sputtering at 600° C. The thus obtained ferroelectric element exhibited Pr of 16 to 20 $\mu C/cm^2$, Ec of 70 to 100 kV/cm and a number of times of writing of the order of $10^{13}$ or larger.

Furthermore, the lower electrode was formed by the same method as the one mentioned above, the ferroelectric thin film was formed in a manner of the embodiment 2 and the upper electrode was formed thereon by the same method as the one described above, in order to obtain a ferroelectric element. The thus obtained ferroelectric element exhibited Pr of 16 to 20 $\mu C/cm^2$, Ec of 70 to 100 kV/cm and a number of times of writing of the order of $10^{12}$ or larger.

Moreover, a ferroelectric element was obtained by forming an electrically conductive oxide of the perovskite structure of any one of $ReO_3$, $SrReO_3$, $BaReO_3$, $LaTiO_3$, $SrVO_3$, $CaCrO_3$, $SrCrO_3$, $SrFeO_3$, $La_{1-x}Sr_xCoO_3$ (0<x<0.5), $LaNiO_3$, $CaRuO_3$, $SrRuO_3$, $SrTiO_3$ and $BaPbO_3$ having a thickness of 2500 Å by sputtering in an oxygen gas atmosphere at a temperature of 650° C. on both sides of the ferroelectric thin film having a width of 0.3 $\mu$m and a thickness of 2500 Å obtained in the embodiment 3. The thus obtained ferroelectric element exhibited Pr of 16 to 20 $\mu C/cm^2$, Ec of 70 to 100 kV/cm and a number of times of writing of the order of $10^{12}$ or larger.

Moreover, a ferroelectric element was obtained by forming an electrically conductive oxide of a single element of any one of $TiO_x$, $VO_x$, EuO, $CrO_2$, $MoO_2$, $WO_2$, PhO, OsO, IrO, PtO, $ReO_2$, $RuO_2$ and $SnO_2$ having a thickness of 1000 Å by sputtering in an oxygen gas atmosphere at a temperature of 450° C. on both sides of the ferroelectric thin film having a width of 0.3 $\mu$m and a thickness of 2500 Å obtained in the embodiment 3. The thus obtained ferroelectric element exhibited Pr of 16 to 20 $\mu C/cm^2$, Ec of 70 to 100 kV/cm and a number of times of writing of the order of $10^{12}$ or larger.

(Embodiment 5)

The upper electrode of a transparent electrically conductive oxide of the present invention was formed on the lower electrode and the ferroelectric thin film by a method described below. A ferroelectric element having a transparent electrode was obtained by forming $In_2O_3$ having a thickness of 1000 Å by sputtering in an oxygen gas atmosphere at 450° C. on the lower electrode and on the ferroelectric thin film obtained in the embodiments 1 and 2. The thus obtained ferroelectric element exhibited Pr of 17 $\mu C/cm^2$, Ec of 100 kV/cm, a number of times of writing of the order of $10^{12}$ or larger and a transmission factor in the visible region of 83%.

Furthermore, a ferroelectric element having a transparent electrode was obtained by forming a transparent electrically conductive oxide of any one of $SnO_2$, ZnO, ITO (In—Sn—O), ATO (Sb-doped Sn), FTO (F-doped Sn) and CTO (Cd—Sn—O) having a thickness of 1000 Å by sputtering in an oxygen gas atmosphere at 450° C. on the lower electrode and on the ferroelectric thin film obtained in the embodiments 1 and 2. The thus obtained ferroelectric element exhibited Pr of 16 to 20 $\mu C/cm^2$, Ec of 70 to 100 kV/cm, a number of times of writing of the order of $10^{12}$ or larger and a transmission factor in the visible region of 83%.

Furthermore, a ferroelectric element having a transparent electrode was obtained by forming a transparent electrically conductive oxide of any one of $In_2O_3$, $SnO_2$, ZnO, ITO (In—Sn—O), ATO (Sb-doped Sn), FTO (F-doped Sn) and CTO (Cd—Sn—O) having a thickness of 2500 Å by sputtering in an oxygen gas atmosphere at 450° C. on both sides of the ferroelectric thin film having a thickness of 0.3 $\mu$m and a thickness of 2500 Å obtained in the embodiment 3. The thus obtained ferroelectric element exhibited Pr of 16 to 20 $\mu C/cm^2$, Ec of 70 to 100 kV/cm, a number of times of writing of the order of $10^{12}$ or larger and a transmission factor in the visible region of 83%.

Furthermore, a transparent electrically conductive oxide of any one of $In_2O_3$, $SnO_2$, ZnO, ITO (In—Sn—O), ATO (Sb-doped Sn), FTO (F-doped Sn) and CTO (Cd—Sn—O) having a thickness of 2500 Å was formed by sputtering in an oxygen gas atmosphere at 450° C. on the left electrode of the ferroelectric thin film having a width of 0.3 $\mu$m and a thickness of 2500 Å obtained in the embodiment 3. On the right electrode was formed an electrically conductive oxide of a single element or an electrically conductive oxide of the perovskite structure having a thickness of 2500 Å by the same method as in the embodiment 4, in order to obtain a ferroelectric element having a transparent electrode. The thus obtained ferroelectric element exhibited Pr of 16 to 20 $\mu C/cm^2$, Ec of 70 to 100 kV/cm, a number of times of writing of the order of $10^{12}$ or larger and a transmission factor in the visible region of 83%.

(Embodiment 6)

In the embodiments 1 to 5, the ferroelectric materials were obtained by using a metal alkoxide as the starting material for spin-coating. It is, however, also possible to obtain a ferroelectric thin film by spin-coating, as a starting solution, a metal salt of acetylacetone, a metal salt of carboxylic acid, acetate, or a metal soap of naphthenic acid or actylic acid.

It is further possible to obtain a similar ferroelectric thin film through the same processing as the one mentioned above even by a dip-coating method using, as a starting solution, a metal alkoxide, a metal salt of acetylacetone, a metal salt of carboxylic acid, or a metal soap of naphthenic acid or octylic acid.

In the embodiments 1 to 5, the ferroelectric thin films having a thickness of 2500 Å were obtained by sputtering in an atmosphere containing oxygen gas under a pressure of from 0.02 to $10^{-4}$ Torr at a forming temperature of from 530° C. to 650° C. for a forming time of one hour.

In the embodiments 1 to 5, furthermore, the ferroelectric thin films having a thickness of 2500 Å were obtained by a laser vaporization method using a sintered product having the same composition as the ferroelectric thin film in an atmosphere containing oxygen gas under a pressure of from 0.3 to $10^{-4}$ Torr at a forming temperature of from 530° C. to 650° C. for a forming time of one hour.

In the embodiments 1 to 5, furthermore, the ferroelectric thin films having a thickness of 2500 Å were obtained by a MOCVD method using, as a starting material, a Å-diketone complex compound or a compound having a phenyl group or an o-tolyl group in an atmosphere containing oxygen gas under a pressure of from 0.3 to $10^{-4}$ Torr at a forming temperature of from 530° C. to 650° C. for a forming time of two hours.

When a laser vaporization method or a MOCVD method was employed, a ferroelectric thin film having a thickness of 2500 Å was obtained in an atmosphere containing excited oxygen (ozone, ECR or microwave plasma) under a pressure of from 0.3 to $10^{-4}$ Torr at a forming temperature of from 500° C. to 620 for a forming time of from 1 to 2 hours.

In the embodiments 1 to 5, furthermore, the same metal, an electrically conductive oxide of a single element, an electrically conductive oxide of the perovskite structure and transparent electrically conductive oxide could be formed through the same processes as those described above.

(Embodiment 7)

FIG. 9 is a sectional view of a ferroelectric memory cell according to the present invention. The method of production will be described. First, the surface of a silicon substrate 95 having a source region 96 and a drain region 97 was oxidized to form an $SiO_2$ film having a thickness of 250 Å. A protruded $SiO_2$ film 99 was formed at the center of the substrate by mask-patterning. Next, the protruded portion was processed by a CVD-method to form a polycrystalline Si film 98 having a thickness of 4500 Å, and was further heated at 800° C. to form a TiN barrier layer 97 having a thickness of 2000 Å. Then, there was formed thereon a ferroelectric element constituted by an upper electrode, a ferroelectric thin film and a lower electrode in accordance with the embodiments 1 to 6 to obtain a ferroelectric memory cell. When a voltage higher than the coersive electric field was applied from the upper electrode to the lower electrode or from the lower electrode to the upper electrode of the ferroelectric element, the ferroelectric memory cell exhibited residual polarization of which the polarity was directed in the direction of the applied voltage. By causing the direction of the residual polarization to correspond to "0" or "1", the data could be written. By applying a voltage lower than the coersive electric field, furthermore, the data "0" or "1" could be written by determining the direction of polarity of polarization. By detecting the current between the source region and the drain region, the thus obtained ferroelectric memory cell was capable of detecting "0" or "1".

(Embodiment 8)

FIG. 10 is a sectional view of a ferroelectric memory cell according to the present invention. The method of production will be described. First, the surface of a silicon substrate 105 having a source region 106 and a drain region 107 was oxidized to form an $SiO_2$ film having a thickness of 250 Å. A protruded $SiO_2$ film 109 was formed at the center of the substrate by mask-patterning. Next, the protruded portion was processed by a CVD method to form a polycrystalline Si film $10^{10}$ having a thickness of 4500 Å and the surface thereof was further oxidized to form an $SiO_2$ film having a thickness of 250 Å thereby to obtain a MOS transistor. A TiN barrier layer of a thickness of 2000 Å was formed by heating it at 800° C. on a capacitor portion corresponding to the semiconductor MOS portion that was obtained. Then, there was formed thereon a ferroelectric element constituted by a upper electrode 101, a ferroelectric thin film 102 and a lower electrode 103 in accordance with the embodiments 1 to 6 to obtain a ferroelectric memory cell. Like that of the embodiment 7, the thus obtained ferroelectric memory cell in which the hysteresis of the ferroelectric material obtained by applying a voltage higher than the coersive electric field is detectable by measuring the change in the storage capacitance.

FIG. 11 is a sectional view of a ferroelectric memory cell according to the present invention. The method of production will be described below. First, a TiN barrier layer 114 having a thickness of 2000 Å was formed by heating at 800° C. on the capacitor portion corresponding to the semiconductor MOS portion obtained by the same method as the one described above. Then, there was formed thereon a ferroelectric element constituted by an upper electrode 111, a ferroelectric thin film 112 and a lower electrode 113 in accordance with the embodiments 1 to 6 thereby to obtain a ferroelectric memory cell. By the same operation as the one mentioned above, the memory cell could similarly detect a change in the storage capacitance.

The ferroelectric memory cells obtained in the embodiments 7 and 8 can be combined in a plural number to constitute a non-contact type read or write memory.

The ferroelectric thin films obtained in the embodiments 1 and 2 exhibited a pyroelectric coefficient of Å=3.0 to 7.5 Å $10^{-8}$ $C/cm^2 K$ which represents the amount of change of Pr depending upon the temperature. The thus obtained ferroelectric thin film can be used as a pyroelectric infrared ray sensor which utilizes a change in the amount of surface charge depending on a change in the temperature.

The ferroelectric element having a transparent electrode obtained in the embodiment 5 can be used for a non-contact type detection system for detecting a voltage that is generated in tune with light pulses produced by chopping a laser beam from an He—Ne laser having a wavelength in the visible region by means of a chopper. When the light has a wavelength transmittable through the transparent electrode, the ferroelectric element can be used for the non-contact type detection system like the one mentioned above.

What is claimed is:

1. A ferroelectric element having an upper electrode, a ferroelectric thin film and a lower electrode, wherein said ferroelectric thin film has a crystalline structure which is comprised of a plurality of unit cells of a perovskite structure superposed one upon another in the C-axis direction, said crystalline structure comprising a blocking layer and first and second layers to cause polarization, said blocking layer being between said first and second layers to cause polarization.

2. A ferroelectric element having an upper electrode, a ferroelectric thin film and a lower electrode, wherein said ferroelectric thin film has a perovskite structure and has a composition represented by:

$$(AO)^{2+}(B_{y-1}C_yO_{3y+1})^{2-} \quad \text{(Chemical formula 42)}$$

A=at least one of Tl, Hg, Ce, Y, Pr, Nd, Pm, Eu, Gd, Tb, Dy, Ho, Er, Tm, Yb, Lu, La, and Sm B=at least one of Bi, Pb, Ca, Sr, and Ba, C=at least one of Ti, Nb, Ta, W, Mo, Fe, Co, Cr, and Zr, and y=2, 3, 4, or 5.

3. A ferroelectric element having an upper electrode, a ferroelectric thin film and a lower electrode, wherein said ferroelectric thin film has a perovskite structure and has a composition represented by:

$$(PbO)^{2+}(B_{y-1}C_yO_{3y+1})^{2-} \quad \text{(Chemical formula 3)}$$

B=at least one of Ca, Sr, and Ba,

C=at least one of Ti, Nb, Ta, W, Mo, Fe, Co, Cr, and Zr, and y=2, 3, 4, or 5.

4. A ferroelectric element according to any one of claims 1 to 3, wherein said ferroelectric thin film is (100)-oriented or (010)-oriented with respect to the lower electrode.

5. A ferroelectric element according to any one of claims 1 to 3, wherein said ferroelectric thin film is (110)-oriented with respect to the lower electrode.

6. A ferroelectric element according to any one of claims 1 to 3, wherein said ferroelectric thin film is (001)-oriented with respect to the lower electrode.

7. A ferroelectric element according to any one of claims 1 to 3, wherein said ferroelectric thin film is so oriented that the c-axis thereof is tilted at 45° with respect to the lower electrode.

8. A ferroelectric element according to claim 4, wherein the ratio of the ferroelectric thin film (100)-oriented or (010)-oriented to the lower electrode is not smaller than 70%.

9. A ferroelectric element according to claim 5, wherein the ratio of the ferroelectric thin film (110)-oriented to the lower electrode is not smaller than 80%.

10. A ferroelectric element according to claim 6, wherein the ratio of the ferroelectric thin film (001)-oriented to the lower electrode is not smaller than 70%.

11. A ferroelectric element according to claim 7, wherein the ratio of the ferroelectric thin film which is so oriented that the c-axis thereof is tilted at 45° with respect to the lower electrode is not smaller than 90%.

12. A ferroelectric element having an upper electrode, a ferroelectric thin film and a lower electrode, wherein said ferroelectric thin film has a crystalline structure which is comprised of a plurality of unit cells of a perovskite structure superposed one upon another in the c-axis direction, said crystalline structure including two blocking layers and first and second layers to cause polarization, said two blocking layers being between the first and second layers to cause polarization, said two blocking layers including Bi, O and another element.

13. A ferroelectric element having an upper electrode, a ferroelectric thin film and a lower electrode, wherein said ferroelectric thin film has a perovskite structure and has a composition represented by:

$$(Bi_{2-x}A_xO_2)^{2+}(B_{y-1}C_yO_{3y+1})^{2-} \quad \text{(Chemical formula 44)}$$

A=at least one of Tl, Hg, Sb, and As,

B=at least one of Bi, Pb, Ca, Sr, Ba, Y, and rare earth elements,

C=at least one of Ti, Nb, Ta, W, Mo, Fe, Co, Cr, and Zr, 0<x<2, and y=1, 2, 3, 4, or 5.

14. A ferroelectric element having an upper electrode, a ferroelectric thin film and a lower electrode, wherein said ferroelectric thin film has a perovskite structure and has a composition represented by:

$$(Bi_{2-x}Pb_xO_2)^{2+}(B_{y-1}C_yO_{3y+1})^{2-} \quad \text{(Chemical formula 45)}$$

B=at least one of Bi, Pb, Ca, Sr, Ba, Y, and rare earth elements,

C at least one of Ti, Nb, Ta, W, Mo, Fe, Co, Cr, and Zr, 0<x<2, and y=1, 2, 3, 4, or 5.

15. A ferroelectric element according to claim 12, 13 or 14, wherein said ferroelectric thin film is (100)-oriented or (010)-oriented with respect to the lower electrode.

16. A ferroelectric element according to claim 12, 13 or 14, wherein said ferroelectric thin film is (110)-oriented with respect to the lower electrode.

17. A ferroelectric element according to claim 12, 13 or 14, wherein said ferroelectric thin film is so oriented that the c-axis thereof is tilted at 45° with respect to the lower electrode.

18. A ferroelectric thin film according to claim 15, wherein the ratio of the ferroelectric thin film (100)-oriented or (010)-oriented to the lower electrode is not smaller than 70%.

19. A ferroelectric element according to claim 16, wherein the ratio of the ferroelectric thin film (110)-oriented to the lower electrode is not smaller than 80%.

20. A ferroelectric element according to claim 17, wherein the ratio of the ferroelectric thin film which is so oriented that the c-axis thereof is tilted at 45° with respect to the lower electrode is not smaller than 90%.

21. A ferroelectric element according to any one of claims 1 to 3, wherein the ferroelectric element has a planar structure with electrodes on both sides of the ferroelectric thin film which is of the perovskite structure, and the width of the ferroelectric thin film is not larger than 0.3 μm.

22. A ferroelectric element of a composition according to claim 12 or 13, a planar-type structure with electrodes on both sides of the ferroelectric thin film which is of the perovskite structure, and the width of the ferroelectric thin film is not larger than 0.3 μm.

23. A lower electrode according to any one of claim 1, 2, 3, 12 or 13, wherein the ferroelectric element is constituted by a metal, an electrically conductive oxide of a single element and an electrically conductive oxide of a perovskite structure from the side of a lower substrate, and said electrically conductive oxides are oriented in a particular plane.

24. A ferroelectric element according to any one of claim 1, 2, 3, 12 or 13, wherein the upper electrode is constituted by an electrically conductive oxide of a perovskite structure, a metal or an electrically conductive oxide of the perovskite structure, an electrically conductive oxide of a single element and a metal in the order from the layer which is in contact with the ferroelectric thin film.

25. A ferroelectric element according to claim 21, wherein a layer of an electrode in contact with the ferroelectric thin film is necessarily constituted by an electrically conductive oxide of a single element or an electrically conductive oxide of a perovskite structure.

26. A ferroelectric element according to claim 24, wherein the metal is at least one element selected from Pt, Au, Al, Ni, Cr, Ti, Mo, and W.

27. An electrically conductive oxide according to claim 23, wherein the electrically conductive oxide of a single element is at least one oxide of Ti, V, Eu, Cr, Mo, W, Ph, Os, Ir, Pt, Re, Ru and Sn, and has a resistivity of not larger than 1 mΩ□cm.

28. An electrically conductive oxide according to claim 23, wherein the electrically conductive oxide of the perovskite structure is a perovskite containing at least one of $ReO_3$, $SrReO_3$, $BaReO_3$, $LaTiO_3$, $SrVO_3$, $CaCrO_3$, $SrCrO_3$, $SrFeO_3$, $La_{1-x}Sr_xCoO_3$ (0<x<0.5), $LaNiO_3$, $CaRUO_3$, $SrRuO_3$, $SrTiO_3$, and $BaPbO_3$, and has a resistivity of not larger than 1 mΩ□cm.

29. A ferroelectric element according to any one of claim 1, 2, 3, 12 or 13, wherein the upper electrode is constituted by a transparent electrically conductive oxide.

30. A ferroelectric element according to claim 20, wherein at least one of the electrodes is constituted by a transparent electrically conductive oxide.

31. A ferroelectric element according to claim 30, wherein the transparent electrically conductive oxide contains at least one of $In_2O_3$, $Sn_2$, ZnO, ITO (In—Sn—O), ATO (Sb-doped Sn), FTO (F-doped Sn) CTO (Cd—Sn—O), has a resistivity of not larger than 1 m□cm, and a transmission factor in a visible region of not smaller than 80%.

32. A ferroelectric memory cell in which the ferroelectric element of any one of claim 1, 2, 3, 12, 13 or 14 is formed on the gate of a semiconductor field effect transistor.

33. A ferroelectric memory cell in which the ferroelectric element of any one of claim 1, 2, 3, 12, 13 or 14 is formed as a capacitor of a semiconductor MOS portion.

34. A ferroelectric memory cell in which the ferroelectric element of claim 20 is formed as a capacitor of a semiconductor MOS portion.

35. An infrared ray sensor, wherein the ferroelectric element according to any one of claim 1, 2, 3, 12, 13 or 14 is a pyroelectric infrared ray sensor.

36. An optical response system comprising a ferroelectric element according to claim 30.

37. A memory including the ferroelectric memory cell according to claim 32 as a non-contact type read memory or write memory.

38. A ferroelectric element according to claim 22, wherein a layer of an electrode in contact with the ferroelectric thin film is necessarily constituted by an electrically conductive oxide of a single element or an electrically conductive oxide of a perovskite structure.

39. A metal according to claim 23, wherein the ferroelectric element is at least one element selected from Pt, Au, Al, Ni, Cr, Ti, Mo, and W.

40. A ferroelectric element according to claim 25, wherein the electrically conductive oxide of a single element is at least one oxide of Ti, V, Eu, Cr, Mo, W, Ph, Os, Ir, Pt, Re, Ru and Sn, and has a resistivity of not larger than 1 mΩ□cm.

41. A ferroelectric element according to claim 24, wherein the electrically conductive oxide of a single element is at least one oxide of Ti, V, Eu, Cr, Mo, W, Ph, Os, Ir, Pt, Re, Ru and Sn, and has a resistivity of not larger than 1 mΩ□cm.

42. A ferroelectric element according to claim 25, wherein the electrically conductive oxide of the perovskite structure is a perovskite containing at least $ReO_3$, $SrReO_3$, $BaReO_3$, $LaTiO_3$, $SrVO_3$, $CaCrO_3$, $SrCrO_3$, $SrFeO_3$, $La_{1-x}Sr_xCoO_3$ (0<x<0.5), $LaNiO_3$, $CaRuO_3$, $SrRuO_3$, $SrTiO_3$, and $BaPbO_3$, and has a resistivity of not larger than 1 mΩ□cm.

43. A ferroelectric element according to claim 24, wherein the electrically conductive oxide of the perovskite structure is a perovskite containing at least $ReO_3$, $SrReO_3$, $BaReO_3$, $LaTiO_3$, $SrVO_3$, $CaCrO_3$, $SrCrO_3$, $SrFeO_3$, $La_{1-x}Sr_xCoO_3$ (0<x<0.5), $LaNiO_3$, $CaRuO_3$, $SrRuO_3$, $SrTiO_3$, and $BaPbO_3$, and has a resistivity of not larger than 1 mΩ□cm.

44. A ferroelectric element according to claim 21, wherein at least one of the electrodes is constituted by a transparent electrically conductive oxide.

45. A ferroelectric element according to claim 29, wherein the transparent electrically conductive oxide containing at least one of $In_2O_3$, $Sn_2$, ITO (In—Sn—O), ATO (Sb-doped Sn), FTO (F-doped Sn) or CTO (Cd—Sn—O), has a resistivity of not larger than 1 m□cm, and a transmission factor in a visible region of not smaller than 80%.

46. An optical response system comprising a ferroelectric element according to claim 29.

47. A memory including the ferroelectric memory cell according to claim 33 as a non-contact type read memory or write memory.

48. A ferroelectric element according to claim 1, wherein the crystalline structure consists of said plurality of unit cells of a perovskite structure superposed one upon another in the c-axis direction.

49. A ferroelectric element according to claim 12, wherein the crystalline structure consists of said plurality of unit cells of a perovskite structure superposed one upon another in the c-axis direction.

* * * * *